(12) United States Patent
Ohashi et al.

(10) Patent No.: US 11,647,337 B2
(45) Date of Patent: *May 9, 2023

(54) DISPLAY PANEL AND DISPLAY APPARATUS

(71) Applicant: Sony Group Corporation, Tokyo (JP)

(72) Inventors: Yoshio Ohashi, Kanagawa (JP); Hiroshi Yoshioka, Kanagawa (JP)

(73) Assignee: Sony Group Corporation

( * ) Notice: Subject to any disclaimer, the term of this patent is extended or adjusted under 35 U.S.C. 154(b) by 0 days.

This patent is subject to a terminal disclaimer.

(21) Appl. No.: 17/724,641

(22) Filed: Apr. 20, 2022

(65) Prior Publication Data

US 2022/0248144 A1    Aug. 4, 2022

Related U.S. Application Data

(63) Continuation of application No. 16/767,673, filed as application No. PCT/JP2018/043685 on Nov. 28, 2018, now Pat. No. 11,337,008.

(30) Foreign Application Priority Data

Dec. 7, 2017 (JP) .............................. JP2017-235533

(51) Int. Cl.
*H04R 17/00* (2006.01)
*H04R 1/02* (2006.01)
(Continued)

(52) U.S. Cl.
CPC ......... *H04R 17/00* (2013.01); *H01L 27/3225* (2013.01); *H01L 27/3244* (2013.01);
(Continued)

(58) Field of Classification Search
CPC ........ H04R 17/00; H04R 1/028; H04R 1/288; H04R 2499/15; H01L 27/3225; H01L 27/3244; H01L 51/0097; H01L 2251/5338
(Continued)

(56) References Cited

U.S. PATENT DOCUMENTS

| 2013/0016497 A1 | 1/2013 | Anderson |
| 2014/0210309 A1 | 7/2014 | Miyoshi |

(Continued)

FOREIGN PATENT DOCUMENTS

| CN | 1980485 A | 6/2007 |
| CN | 103852927 A | 6/2014 |

(Continued)

OTHER PUBLICATIONS

"226th issue: Quiet Battle of Flexible Organic EL Substrate", Electronic Device Industry News, Sangyo Times Inc., Dec. 1, 2017, p. 1, Internet: URL:https://www.sangyo-times.jp/article.aspx?ID=2455>, non-official translation, Retrieved Online Jan. 31, 2019. Please see English-language version of International Search Report for translation.

(Continued)

*Primary Examiner* — Sean H Nguyen
(74) *Attorney, Agent, or Firm* — Lerner David LLP

(57) ABSTRACT

A display panel according to an embodiment of the present disclosure includes a flexible organic electroluminescent panel, and one or a plurality of piezoelectric films provided on a rear surface of the organic electroluminescent panel and vibrating the organic electroluminescent panel as a flat speaker.

12 Claims, 40 Drawing Sheets

(51) Int. Cl.
  *H04R 1/28* (2006.01)
  *H01L 27/32* (2006.01)
  *H01L 51/00* (2006.01)

(52) U.S. Cl.
  CPC ......... *H01L 51/0097* (2013.01); *H04R 1/028* (2013.01); *H04R 1/288* (2013.01); *H01L 2251/5338* (2013.01); *H04R 2499/15* (2013.01)

(58) Field of Classification Search
  USPC .......................................................... 381/333
  See application file for complete search history.

(56) References Cited

U.S. PATENT DOCUMENTS

| | | |
|---|---|---|
| 2016/0117994 A1 | 4/2016 | Lee |
| 2017/0161868 A1 | 6/2017 | Kim et al. |
| 2017/0280531 A1 | 9/2017 | Tada et al. |
| 2018/0069172 A1 | 3/2018 | Fukunaga et al. |

FOREIGN PATENT DOCUMENTS

| | | |
|---|---|---|
| CN | 104282232 A | 1/2015 |
| CN | 104461115 A | 3/2015 |
| CN | 106453759 A | 2/2017 |
| CN | 107295447 A | 10/2017 |
| EP | 2741128 A1 | 6/2014 |
| JP | H0555686 U | 7/1993 |
| JP | 2016072127 A | 5/2016 |
| KR | 20050048368 A | 5/2005 |
| WO | 2017091509 A1 | 6/2017 |

OTHER PUBLICATIONS

International Search Report from Application No. PCT/JP2018/043685 dated Feb. 19, 2019, 2 pages.

Search Report from First Office Action for Chinese Application No. 2018800776733 dated Apr. 6, 2021; 3 pages.

Wang Shanyang, "Computers and Networks," Jun. 5, 2017, Sony OLED Television A1 Laucnh Release, p. 25.

Yamamoto, Dream Seed, Samsung acquires a trademark YOUM on a flexible organic EL display, Jun. 10, 2012, p. 2, Internet:<URL:https://web.archive.org/web/20120610053003/https://www.dream-seed.com/weblog/archives/2012/04/14619/>, non-official translation, Retrieved Online Jan. 31, 2019. Please see English-language version of International Search Report for translation.

[ FIG. 1 ]
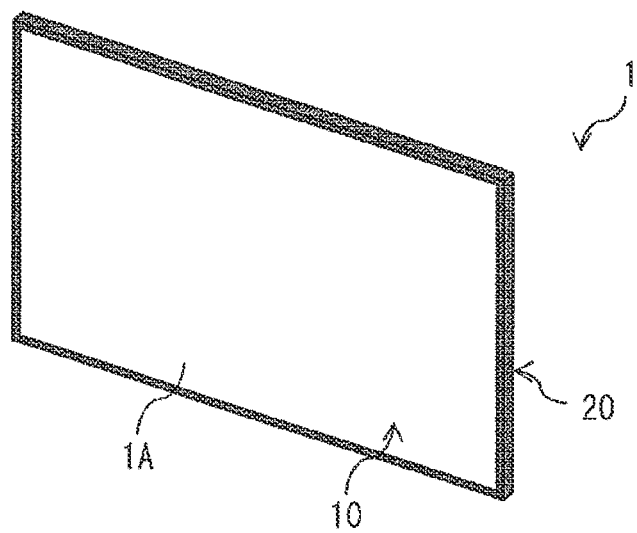
[ FIG. 2 ]
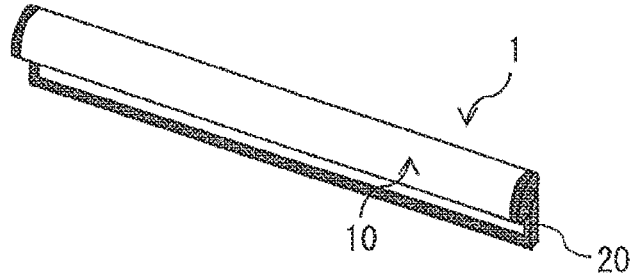
[ FIG. 3 ]
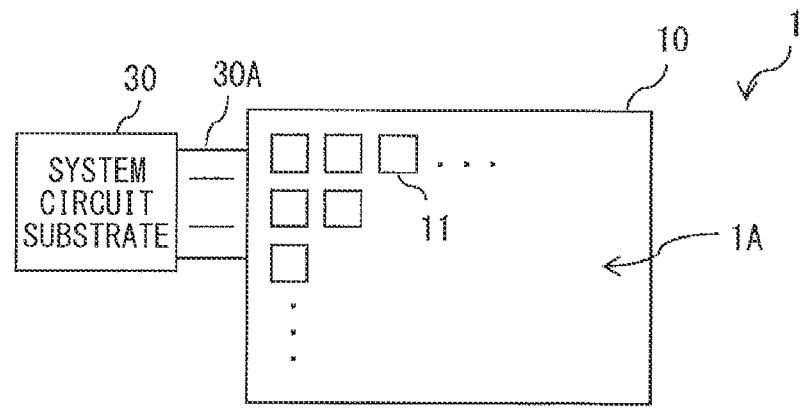

[FIG. 4]
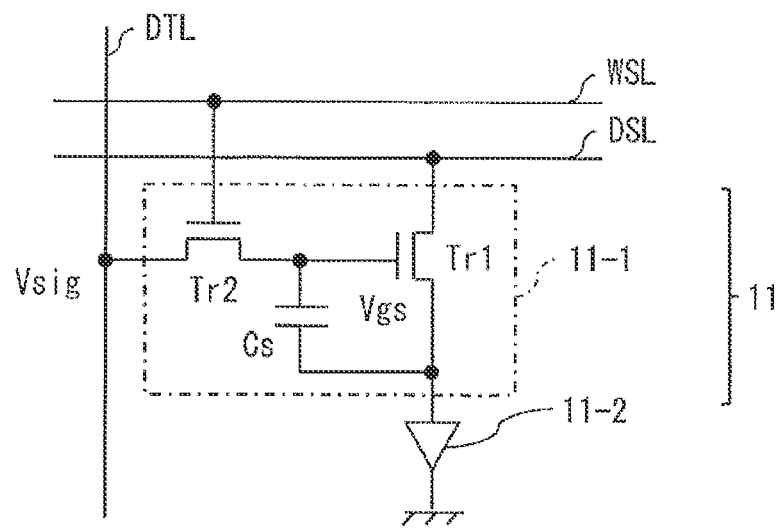
[FIG. 5]
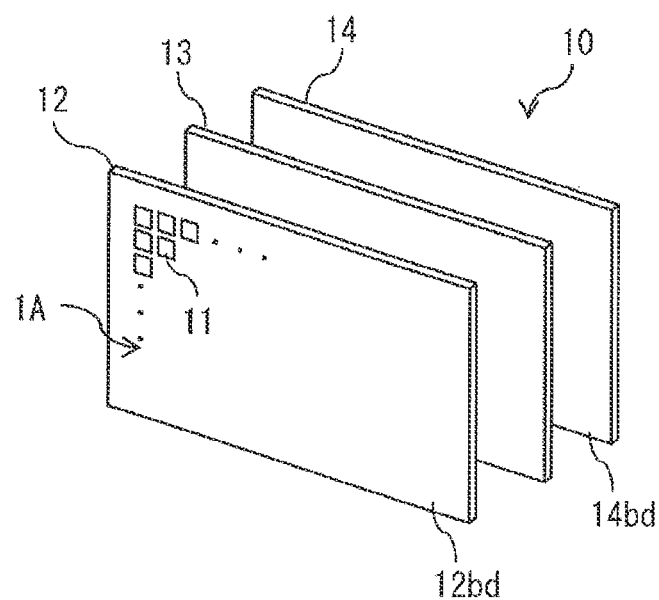

[ FIG. 6 ]
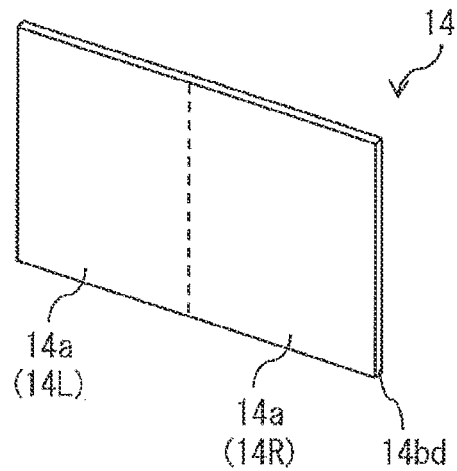
[ FIG. 7 ]
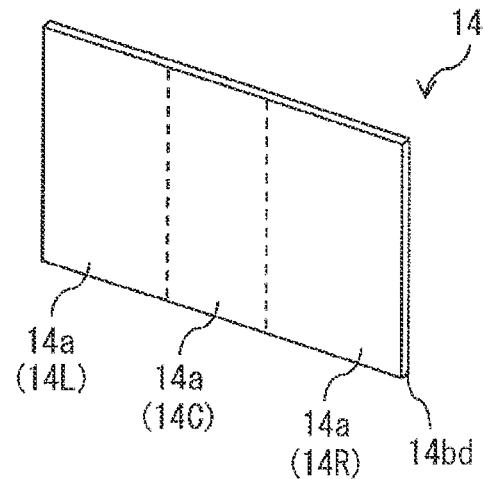
[ FIG. 8 ]
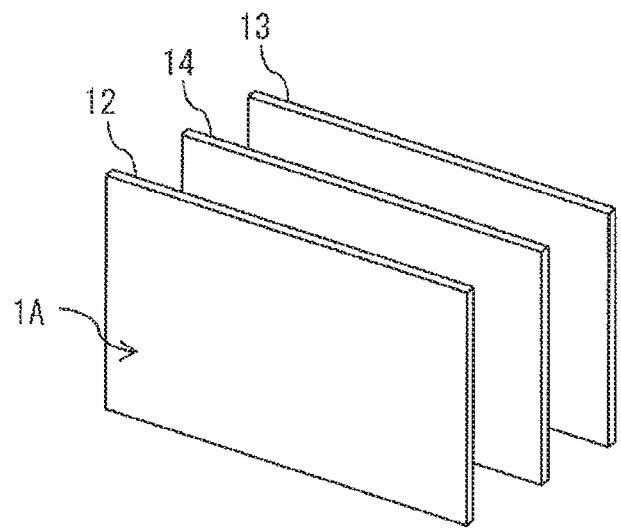

[ FIG. 9 ]
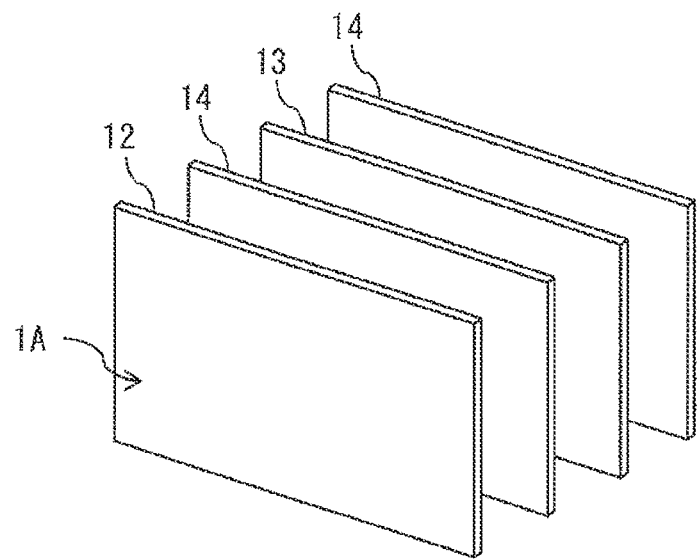
[ FIG. 10 ]
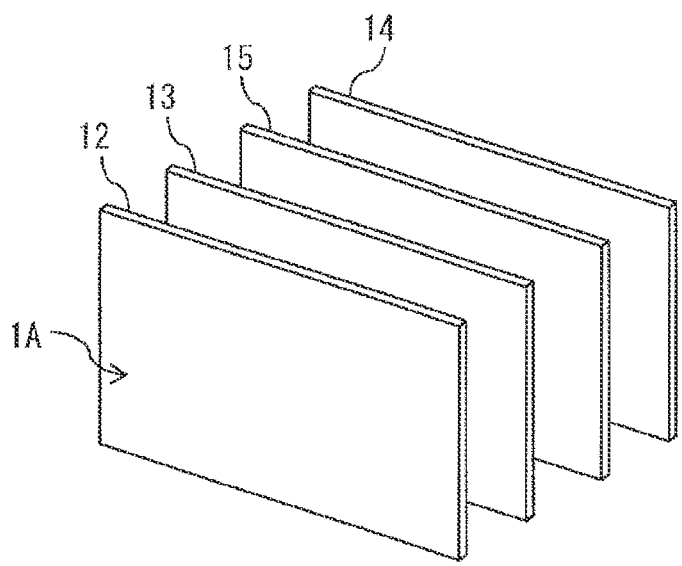

[FIG. 11]
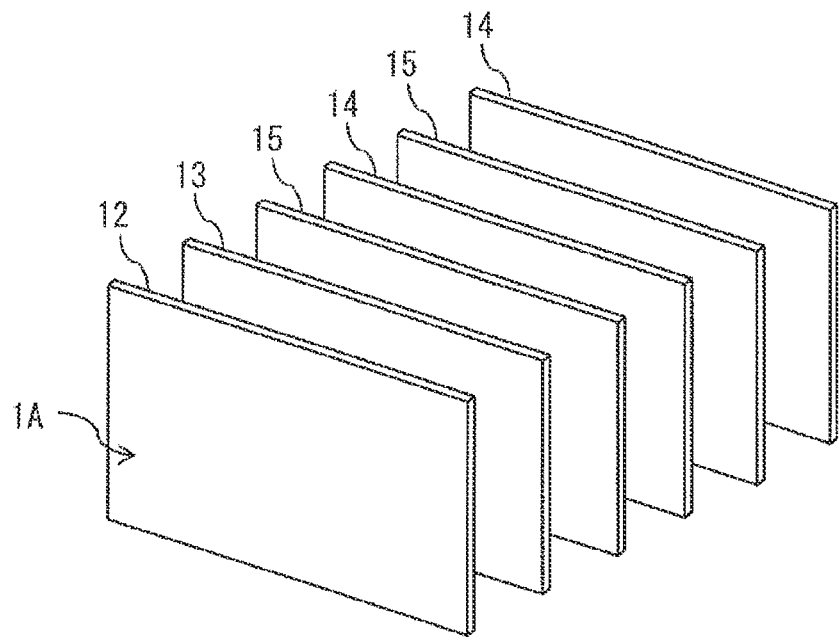
[FIG. 12]
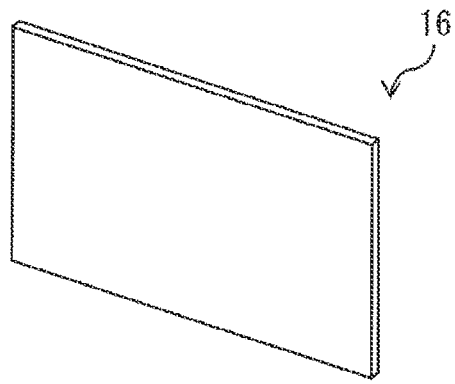
[FIG. 13A]
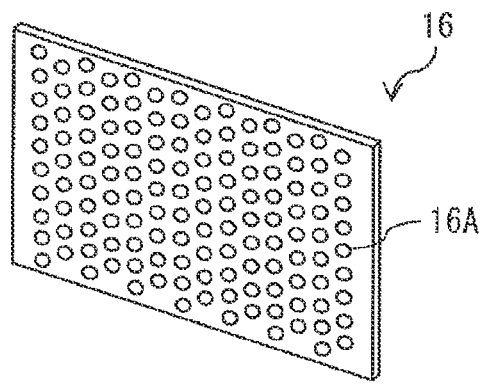

[ FIG. 13B ]
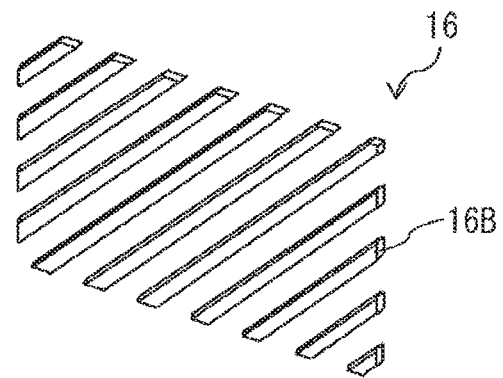
[ FIG. 13C ]
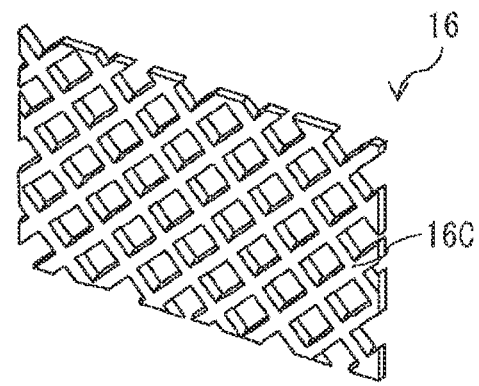
[ FIG. 14 ]
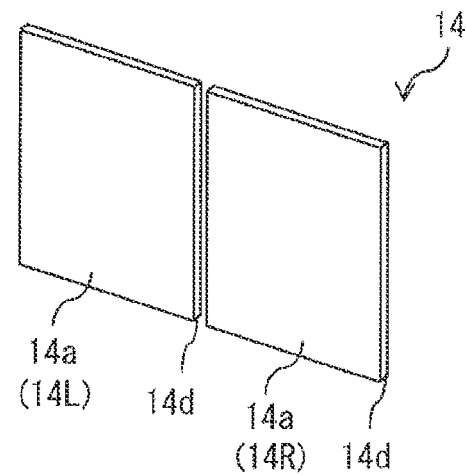

[ FIG. 15 ]
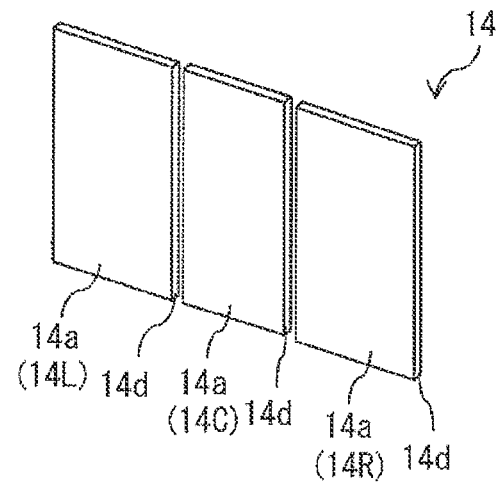
[ FIG. 16 ]
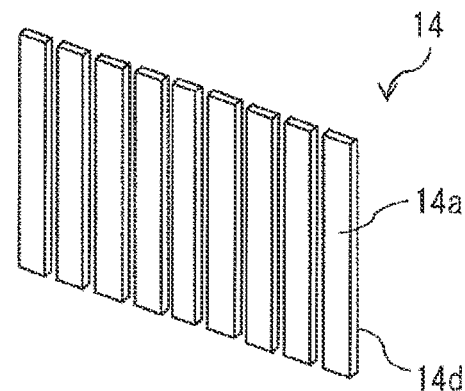
[ FIG. 17 ]
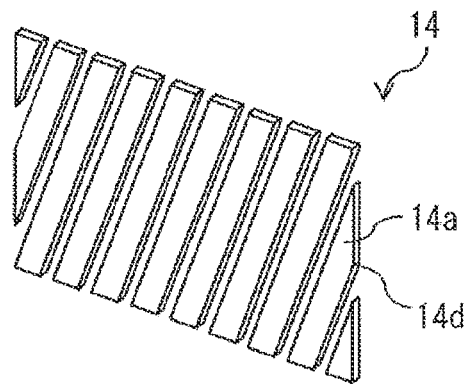

[ FIG. 18 ]
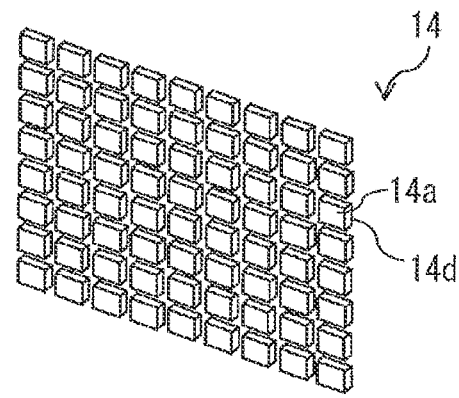
[ FIG. 19A ]
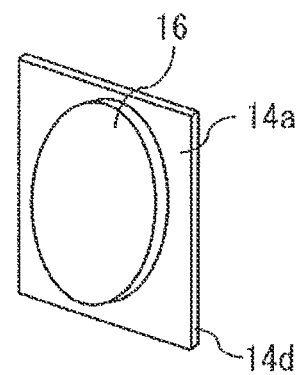
[ FIG. 19B ]
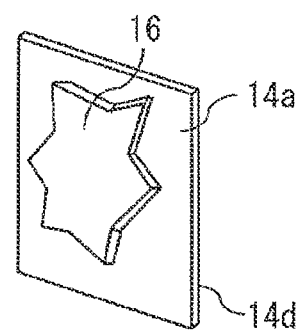

[ FIG. 19C ]
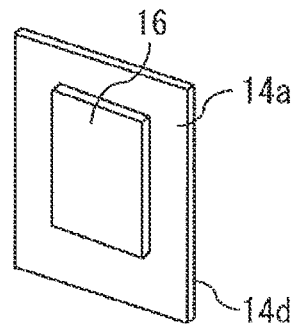
[ FIG. 20A ]
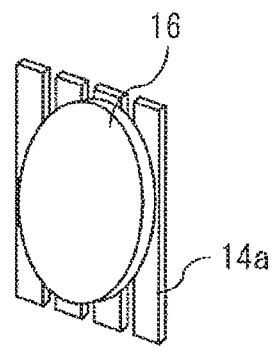
[ FIG. 20B ]
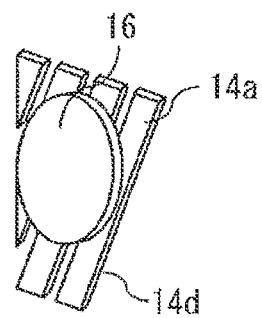
[ FIG. 20C ]
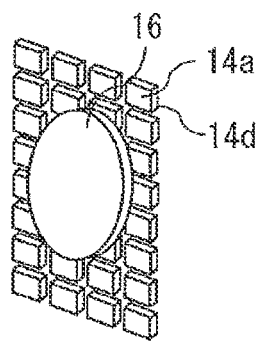

[ FIG. 21 ]
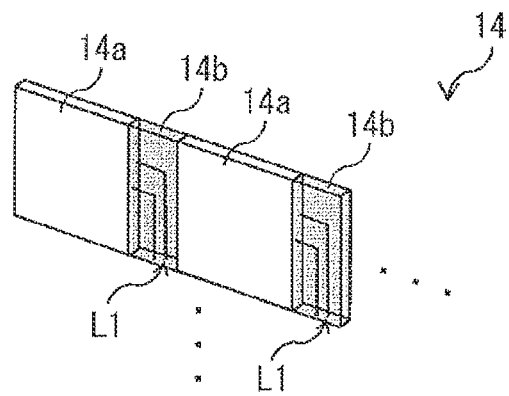
[ FIG. 22 ]
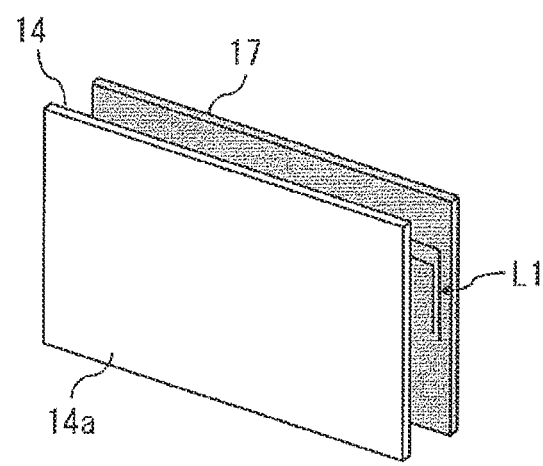
[ FIG. 23 ]
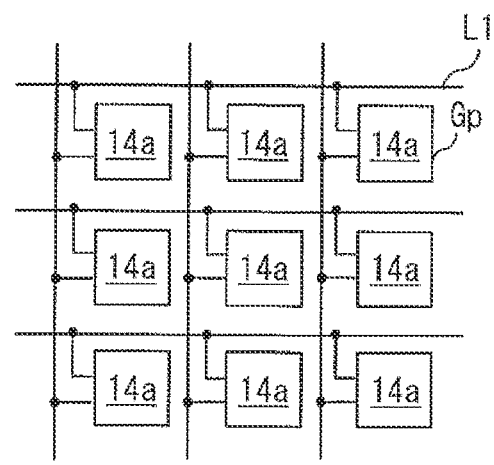

[ FIG. 24 ]
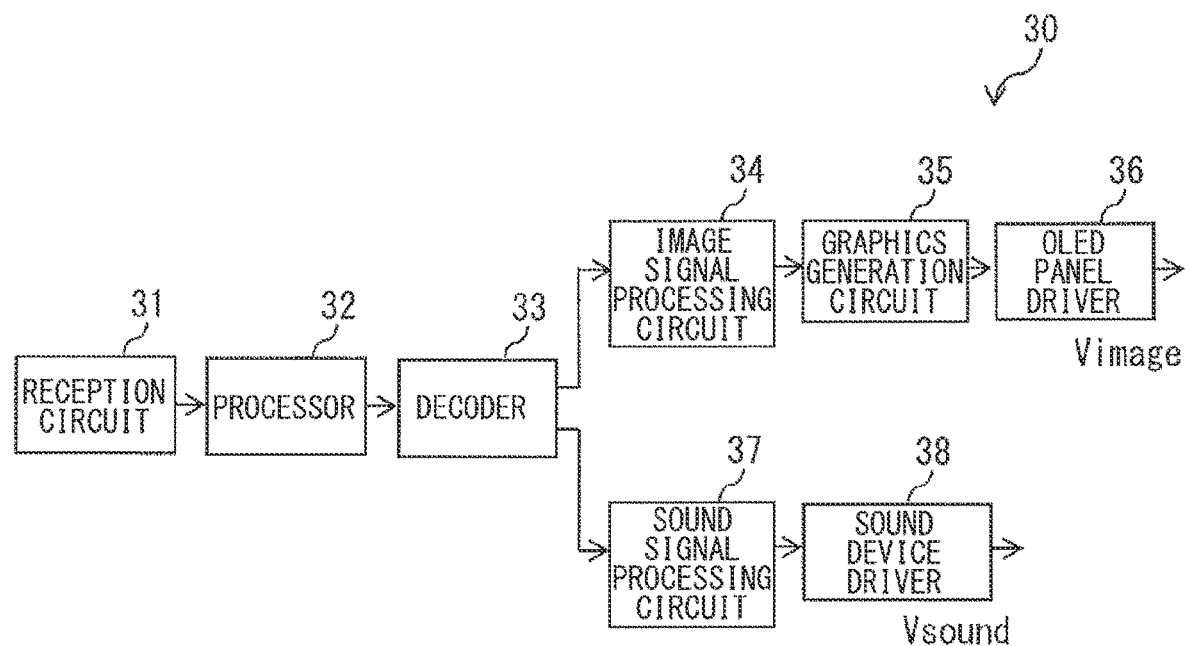
[ FIG. 25 ]
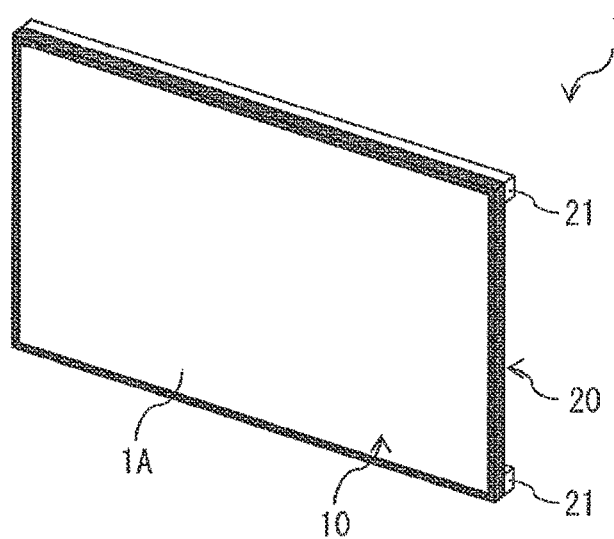

[ FIG. 26 ]
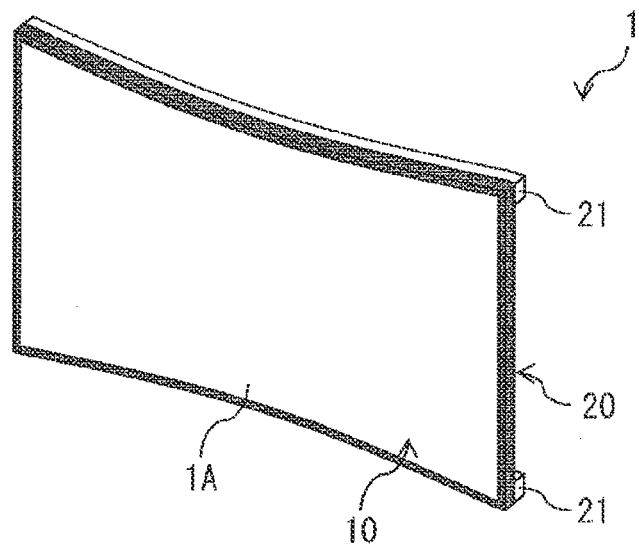
[ FIG. 27 ]
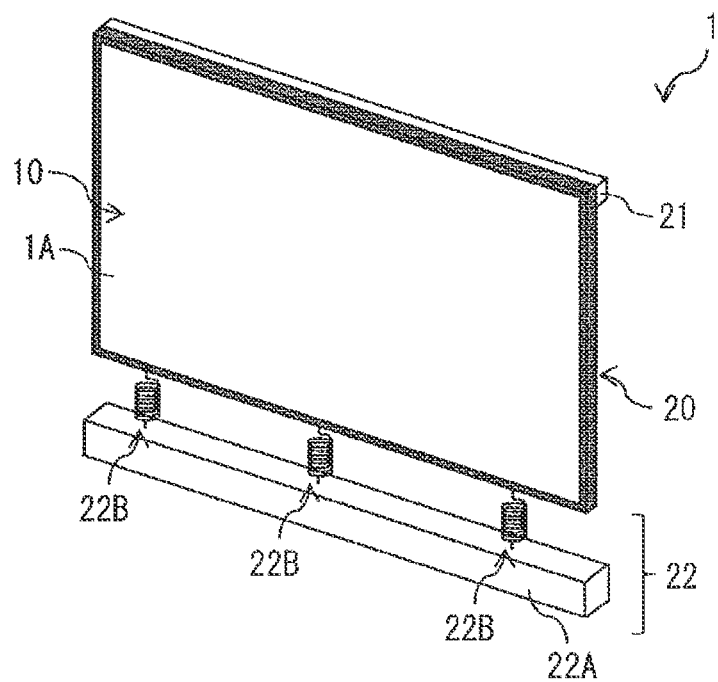

[ FIG. 28 ]
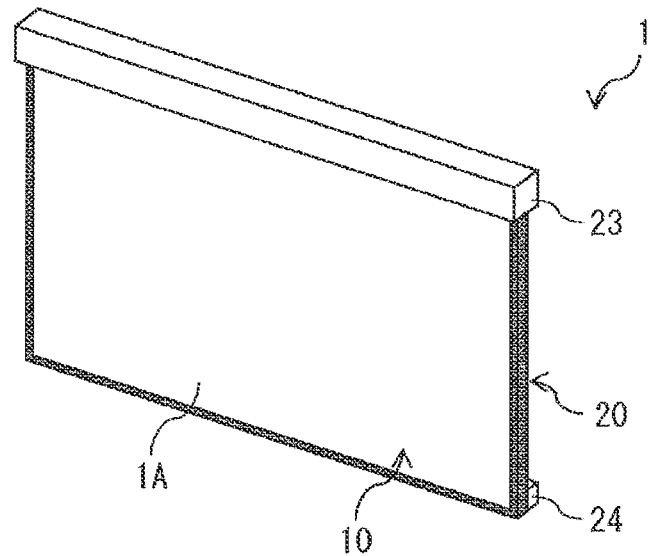
[ FIG. 29 ]
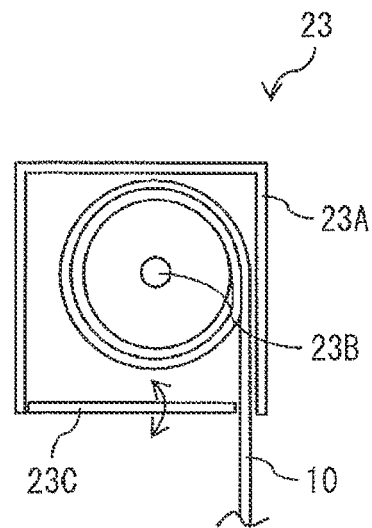
[ FIG. 30 ]
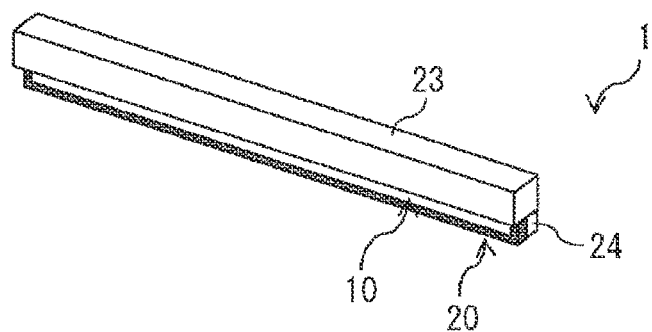

[ FIG. 31 ]
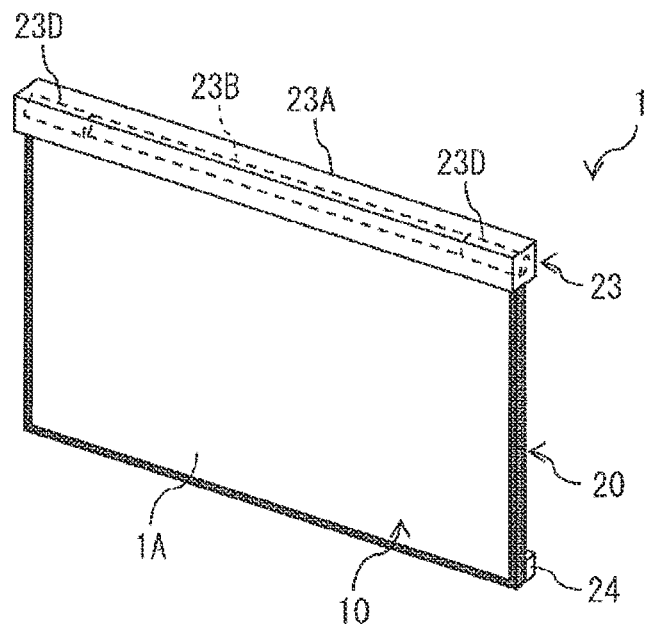
[ FIG. 32 ]
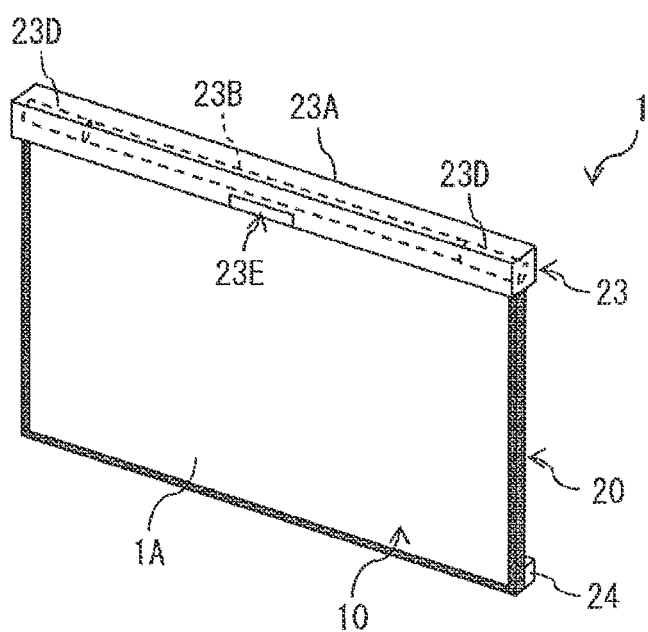

[ FIG. 33 ]
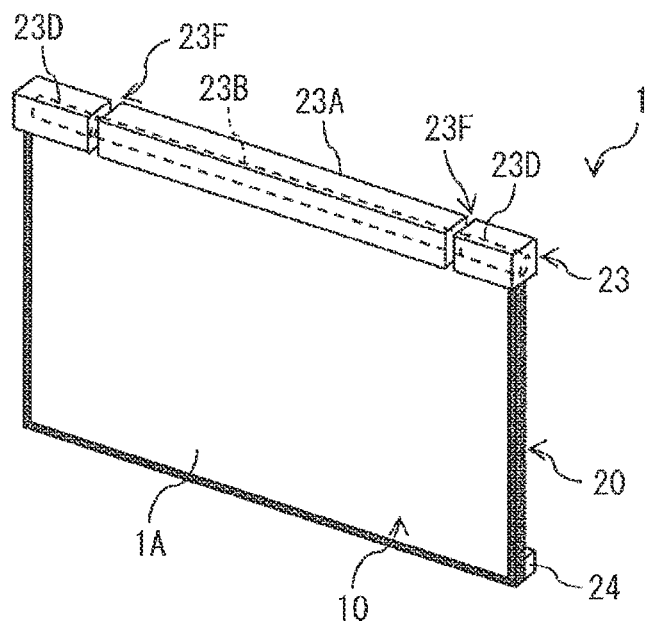
[ FIG. 34 ]
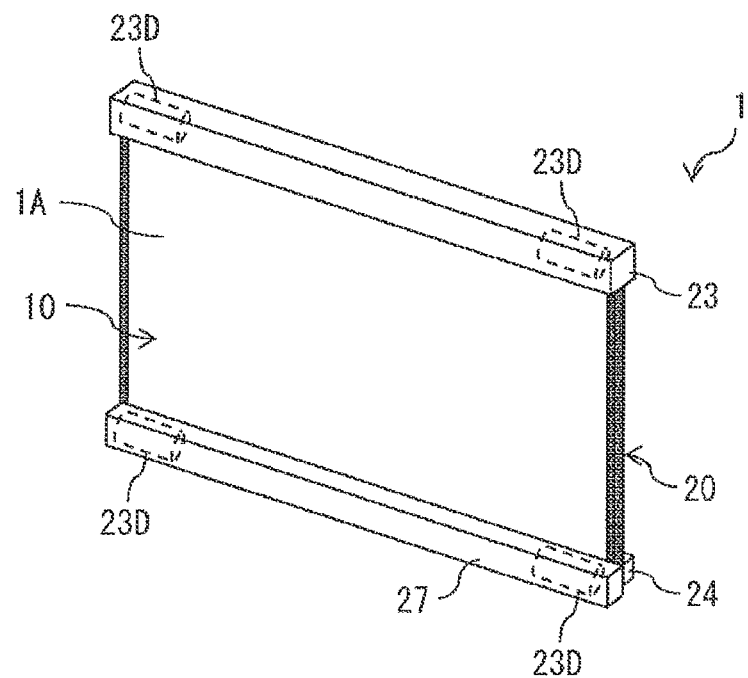

[ FIG. 35 ]
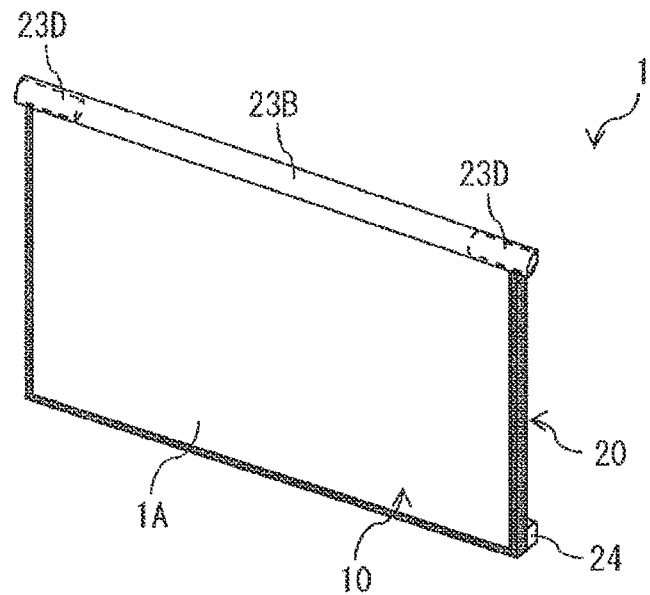
[ FIG. 36 ]
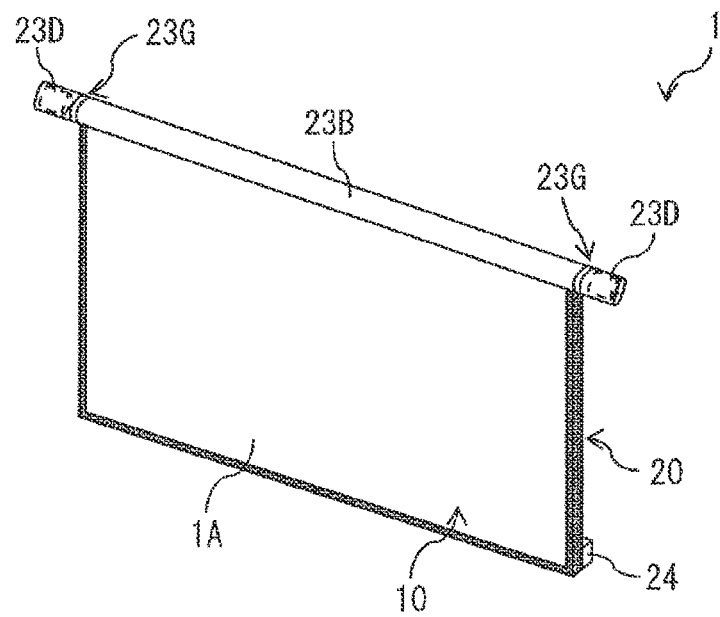

[ FIG. 37 ]
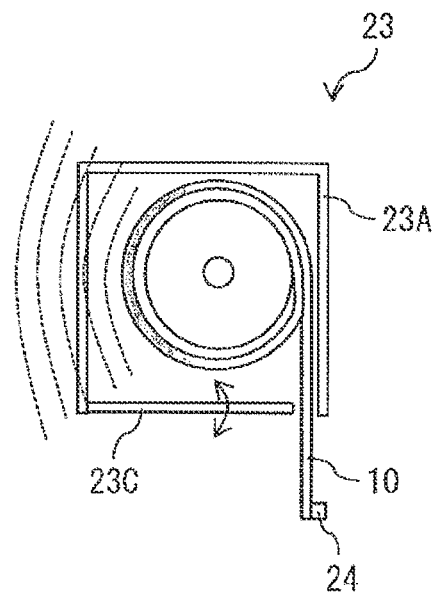
[ FIG. 38 ]
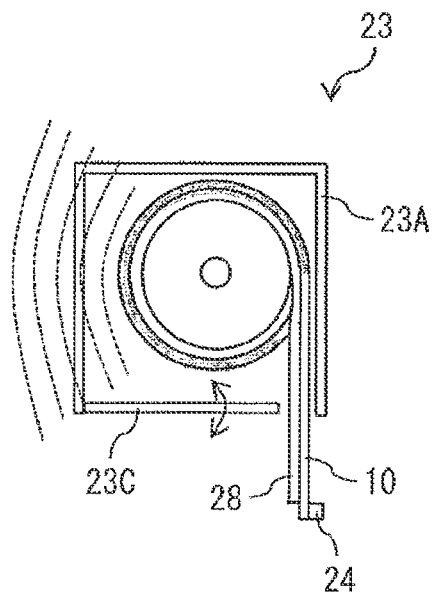

[ FIG. 39 ]
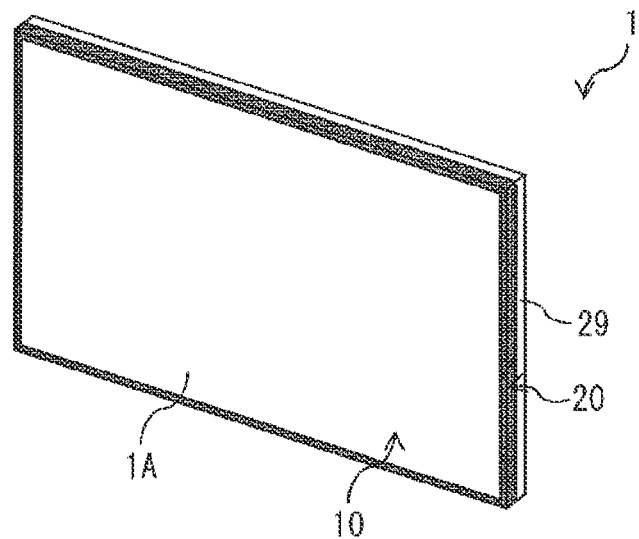
[ FIG. 40 ]
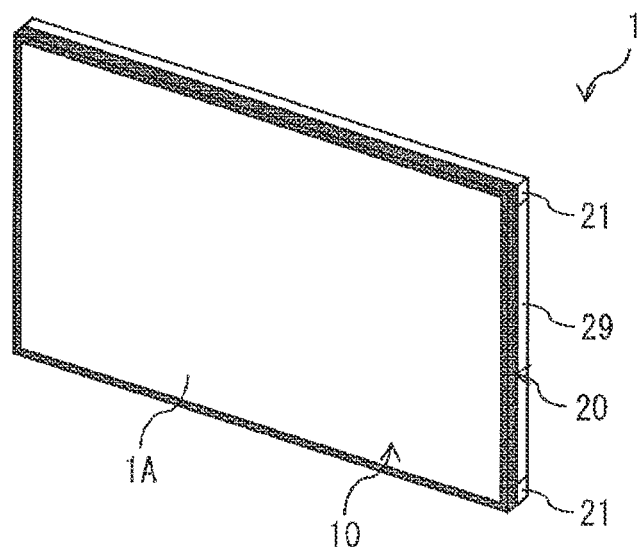

[ FIG. 41 ]
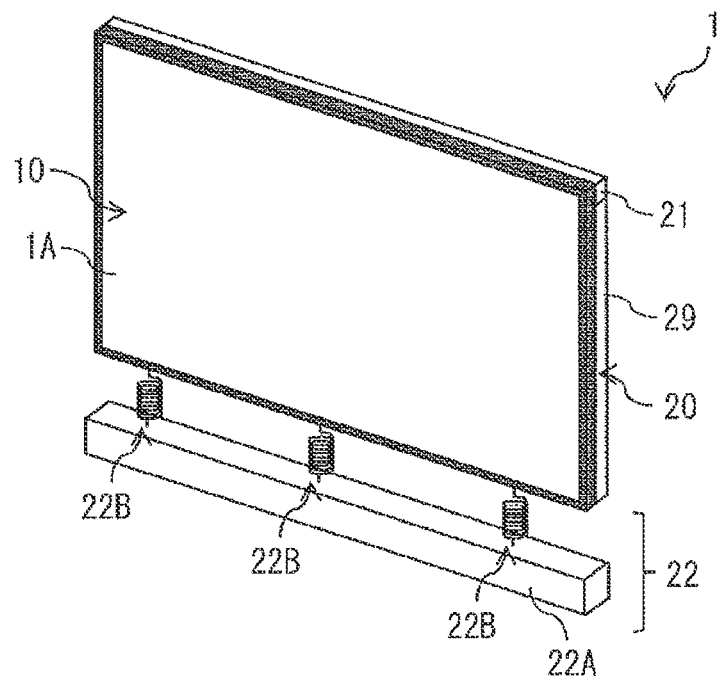
[ FIG. 42 ]
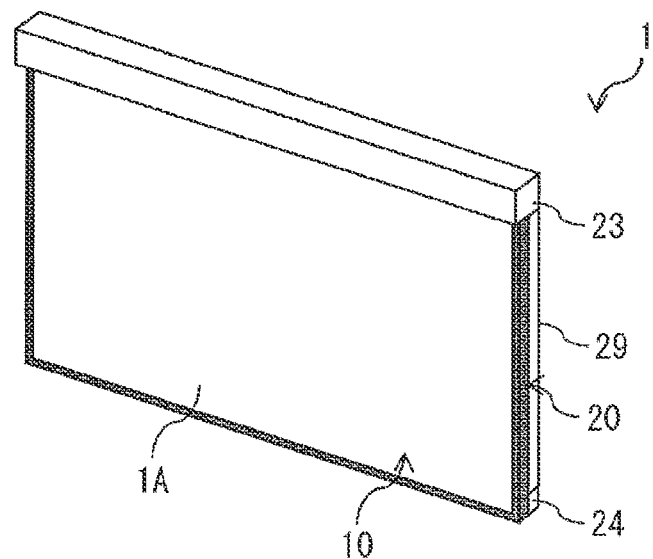

[ FIG. 43 ]
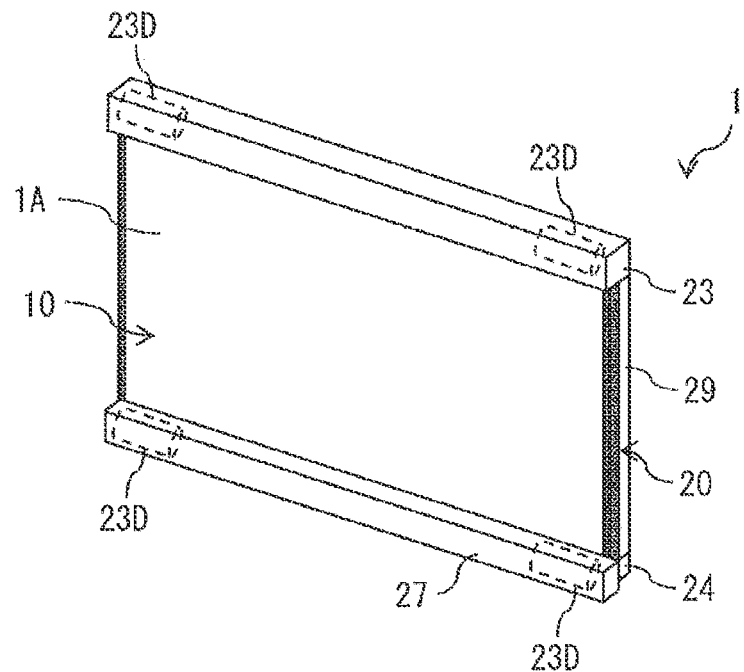
[ FIG. 44 ]
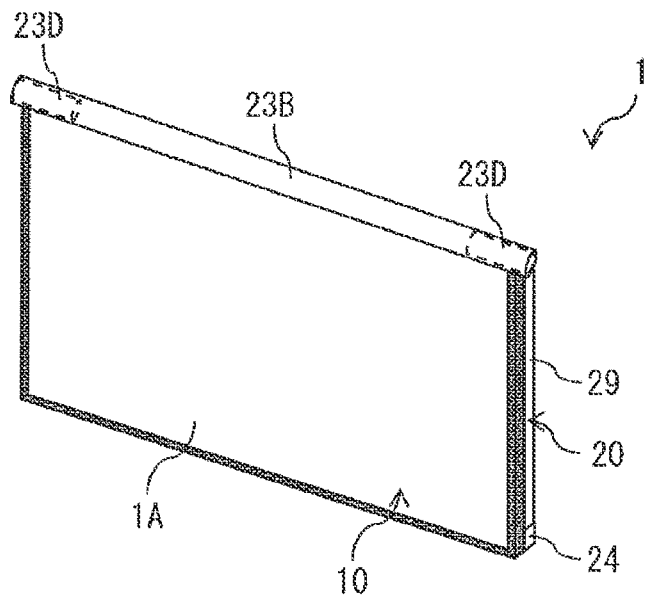

[ FIG. 45 ]
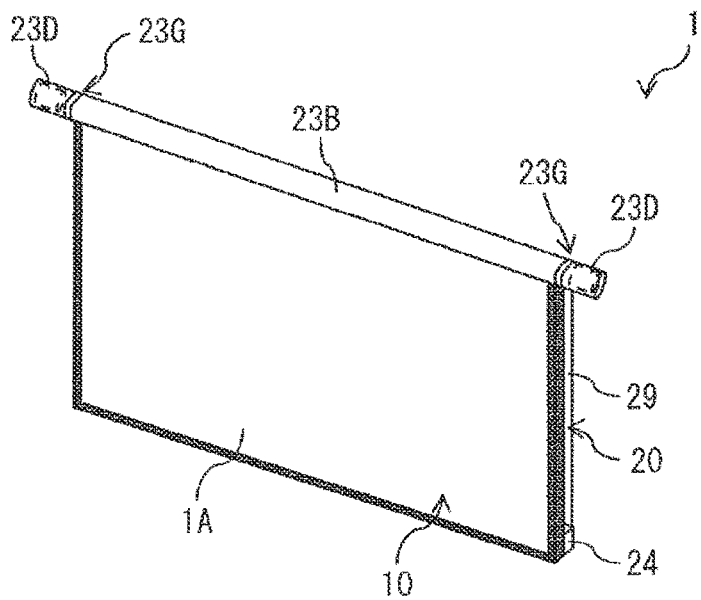
[ FIG. 46 ]
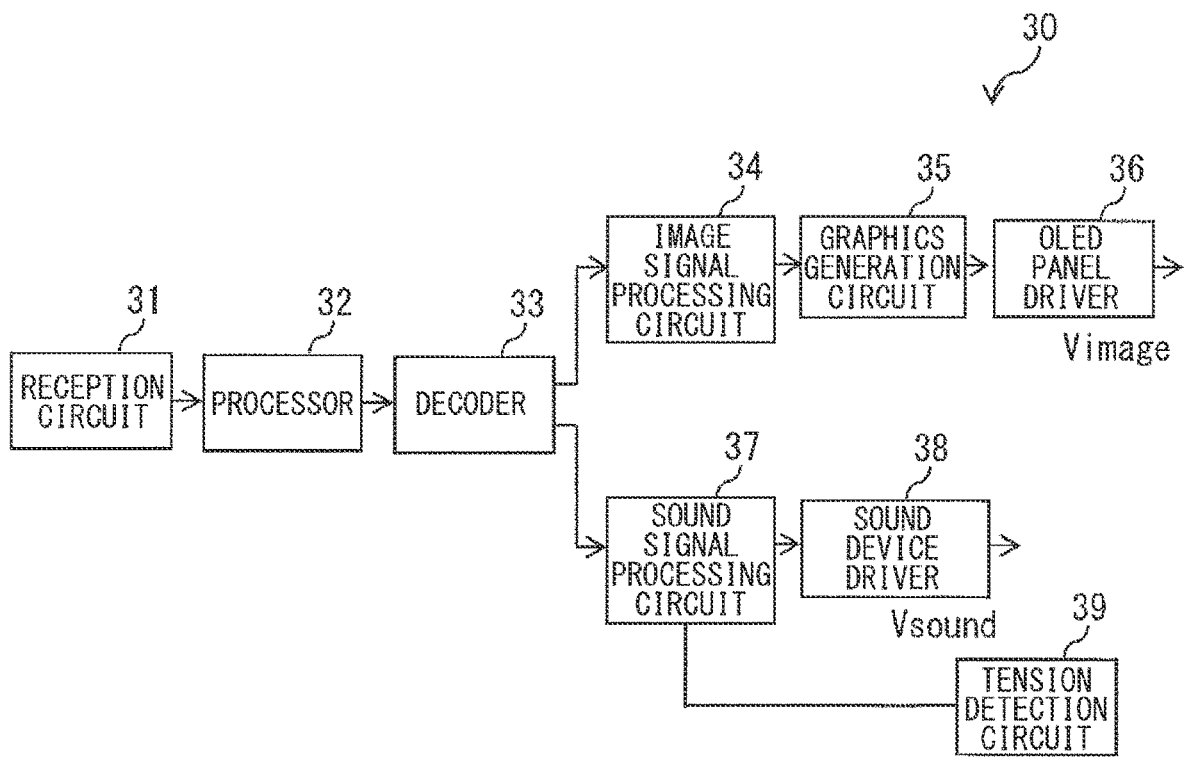

[ FIG. 47 ]
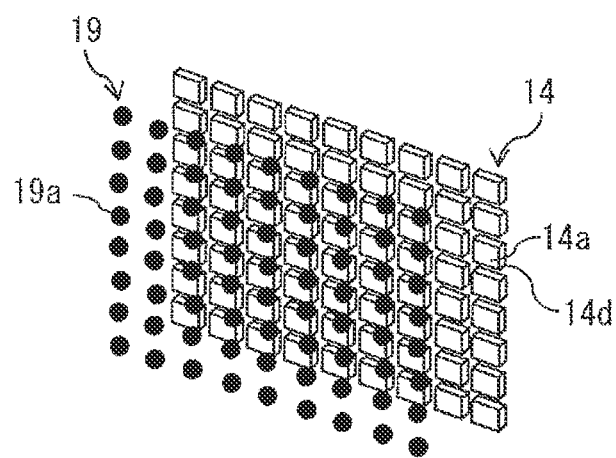
[ FIG. 48 ]
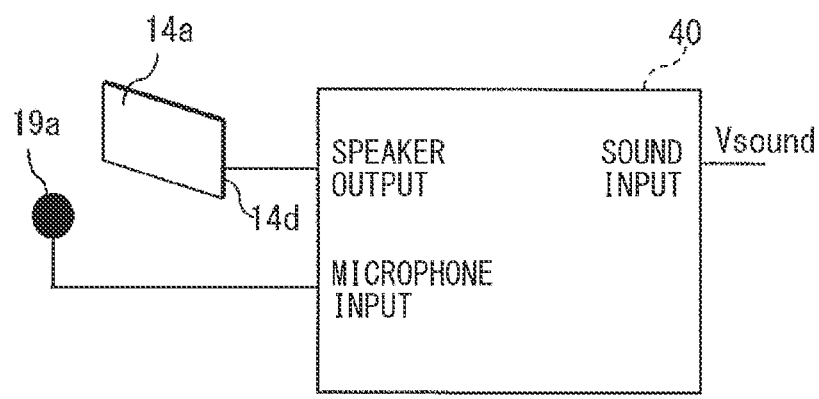

[ FIG. 49 ]
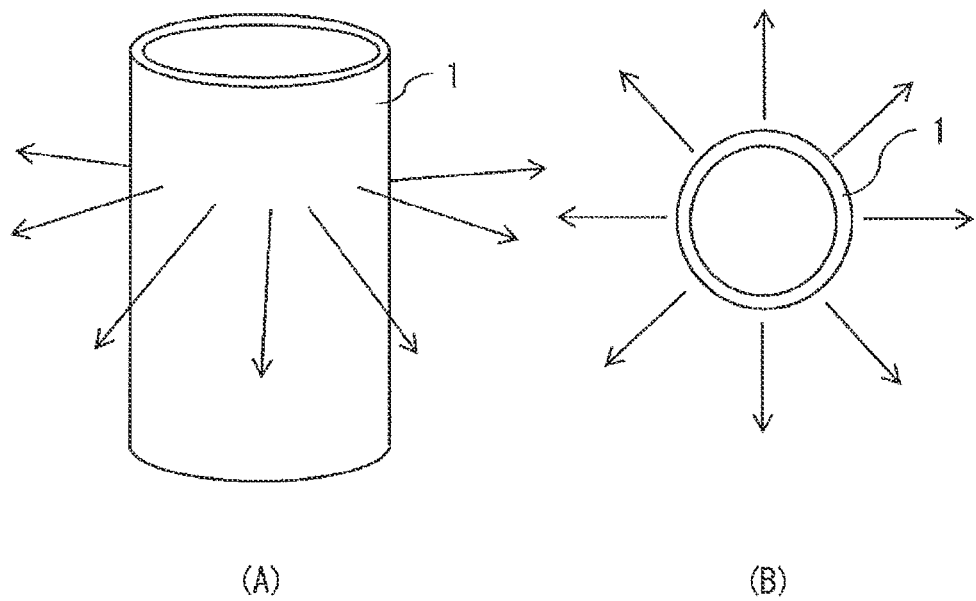
(A)　　　　　　　　　(B)
[ FIG. 50 ]
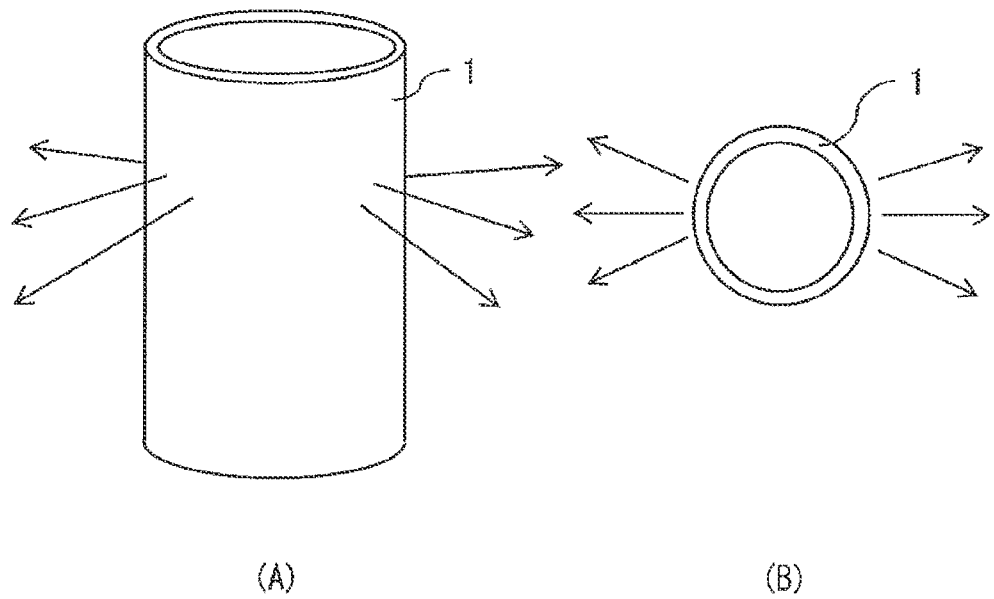
(A)　　　　　　　　　(B)

[ FIG. 51 ]
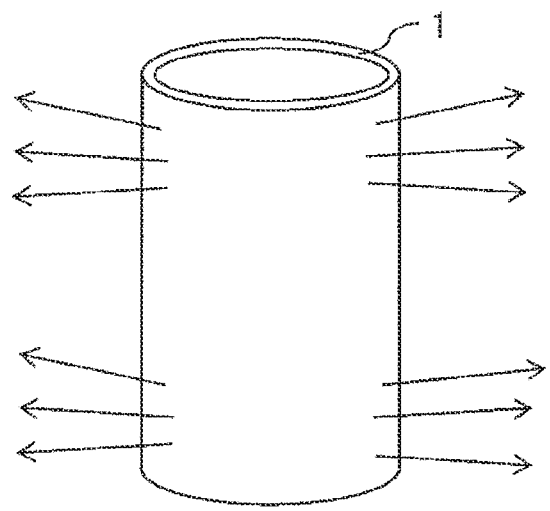
[ FIG. 52 ]
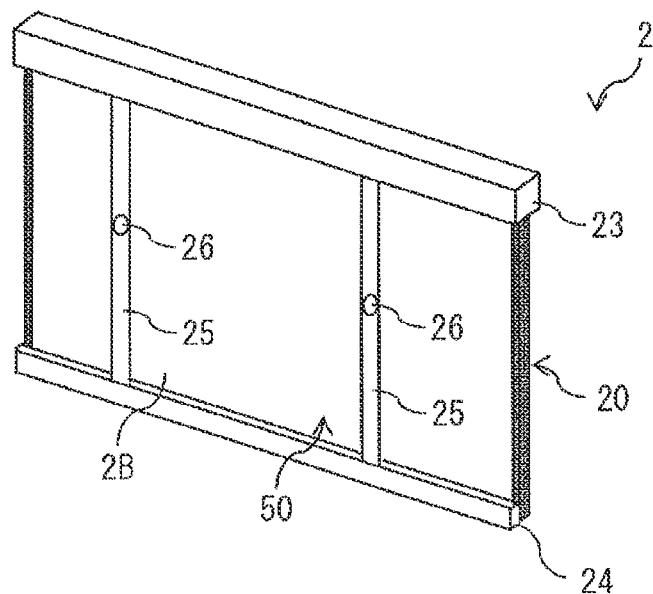
[ FIG. 53 ]
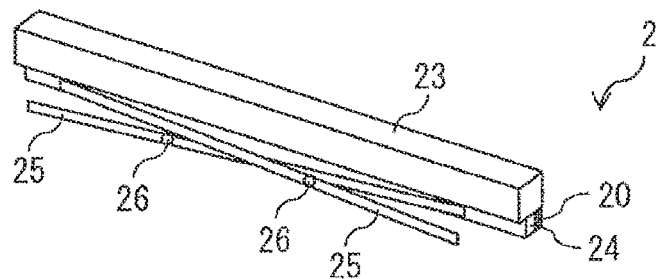

[ FIG. 54 ]
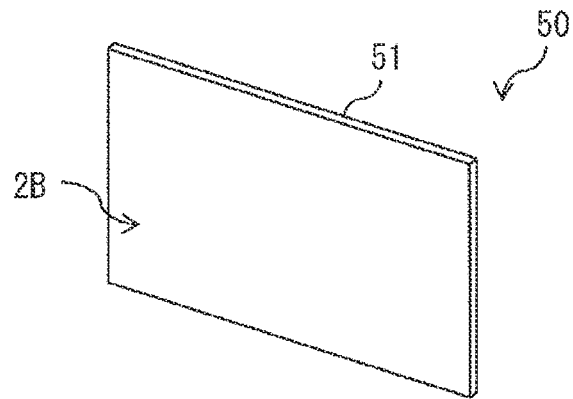
[ FIG. 55 ]
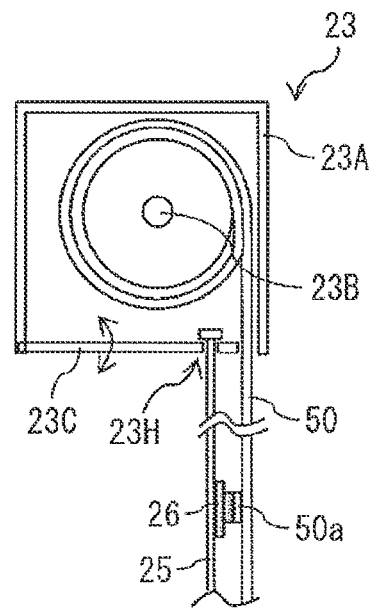
[ FIG. 56 ]
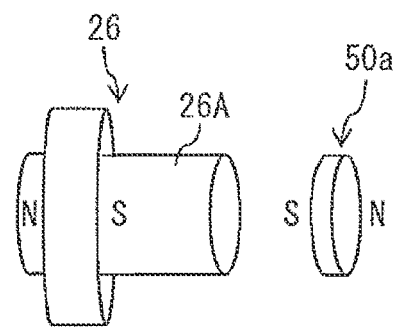

[FIG. 57]
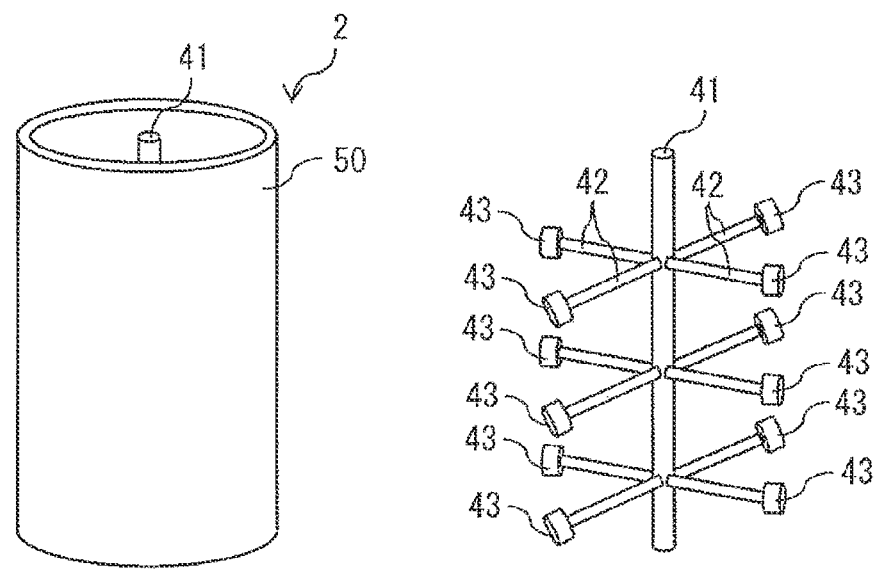
(A)          (B)
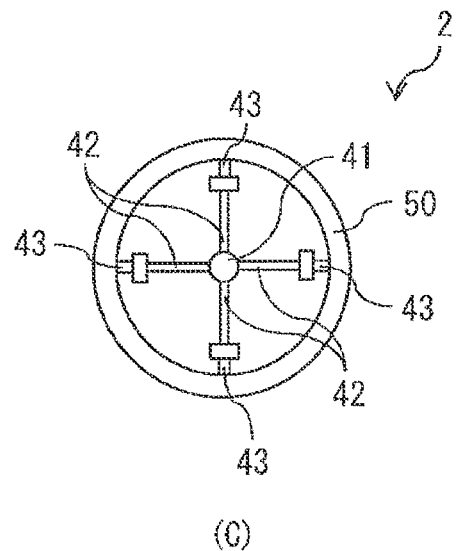
(C)

[FIG. 58]
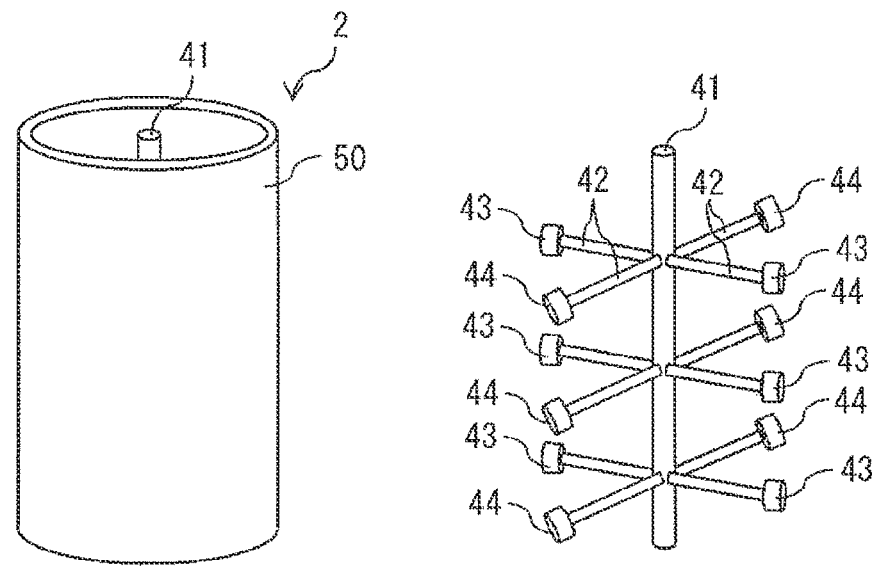
(A)  (B)
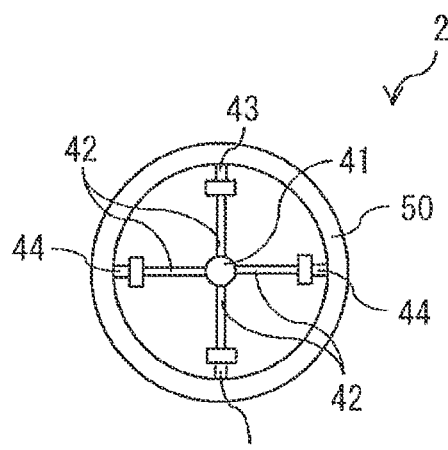
(C)

[ FIG. 59 ]
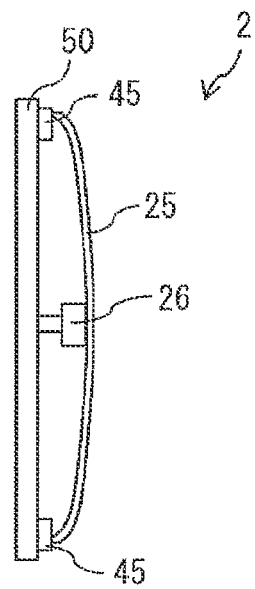
[ FIG. 60 ]
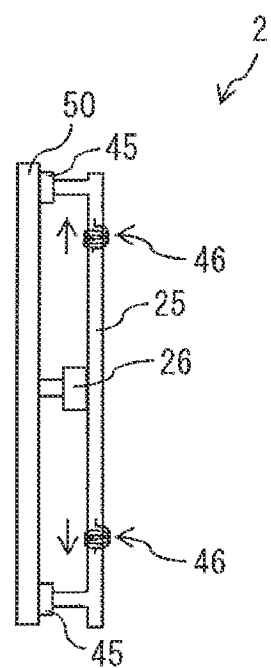

[ FIG. 61 ]
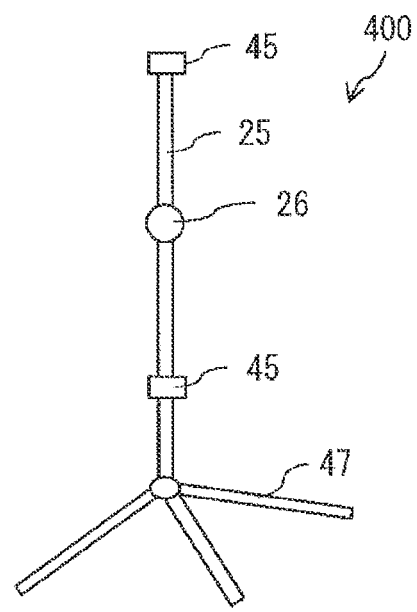
[ FIG. 62 ]
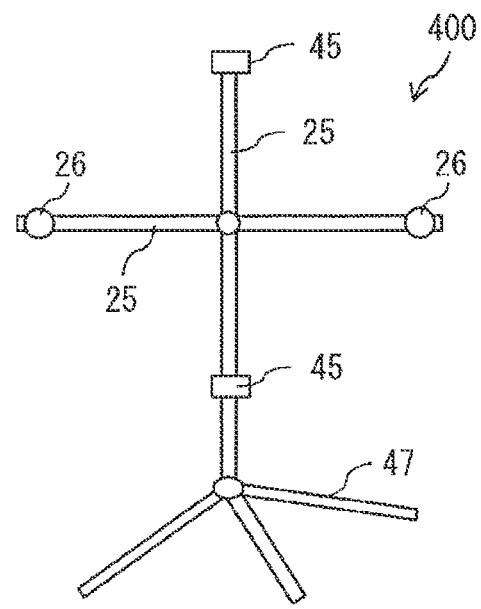

[ FIG. 63 ]
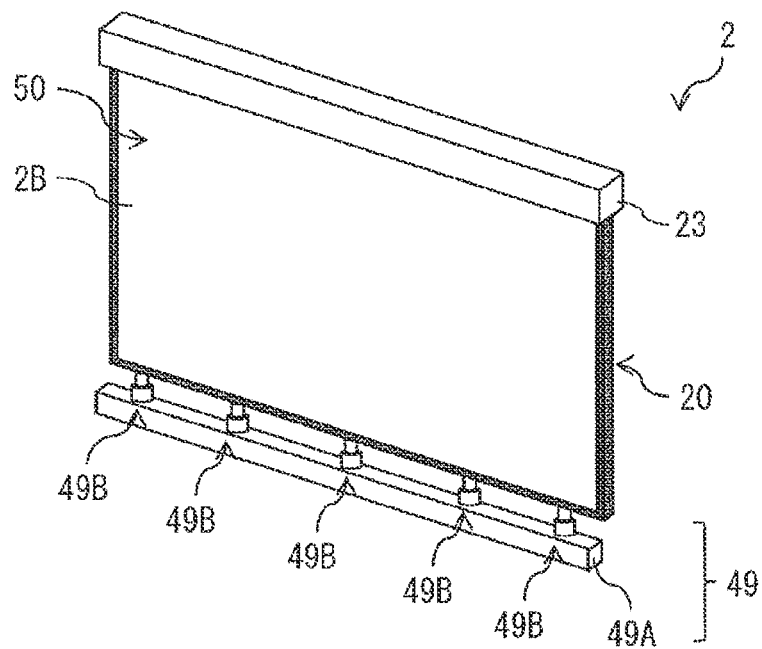
[ FIG. 64 ]
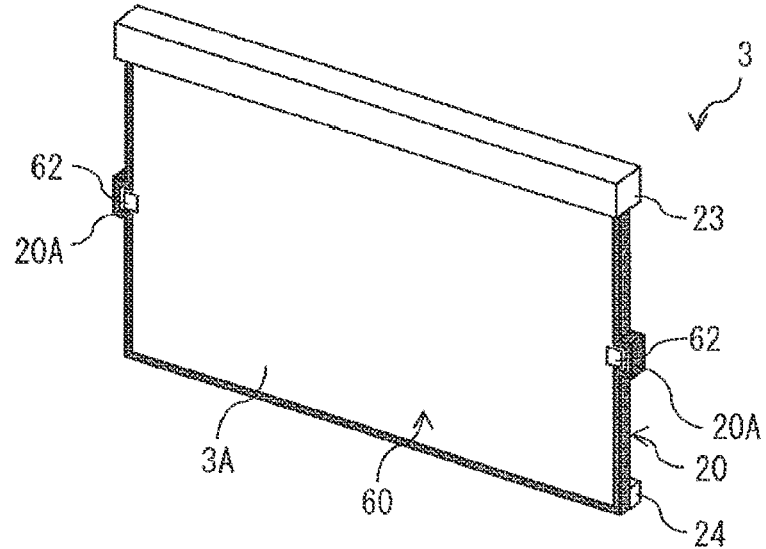
[ FIG. 65 ]
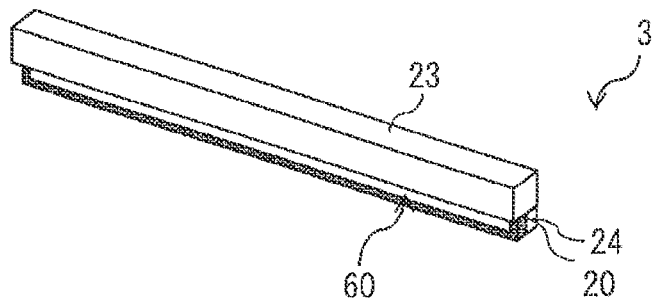

[ FIG. 66 ]
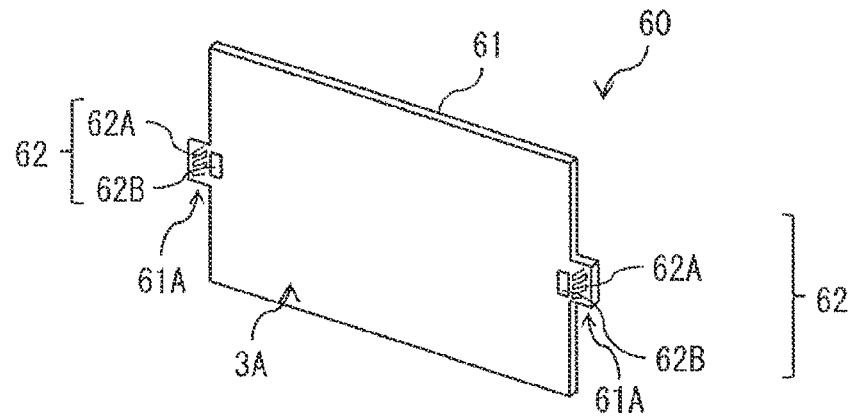
[ FIG. 67 ]
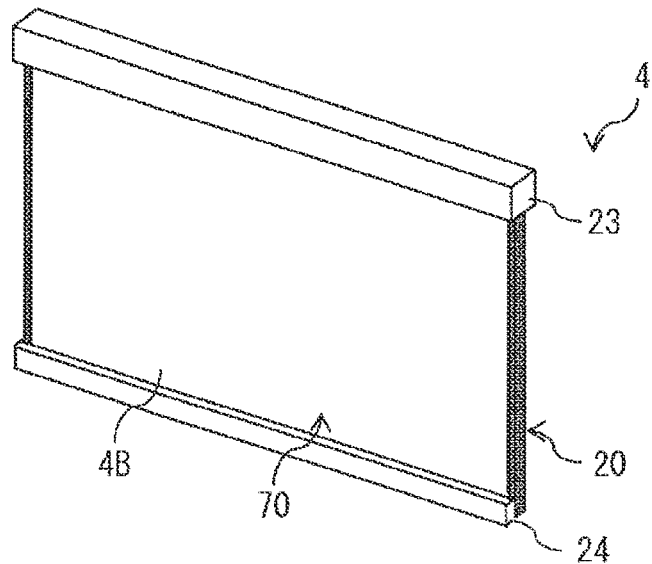
[ FIG. 68 ]
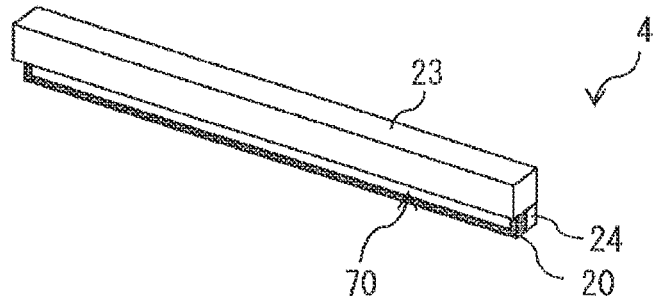

[ FIG. 69 ]
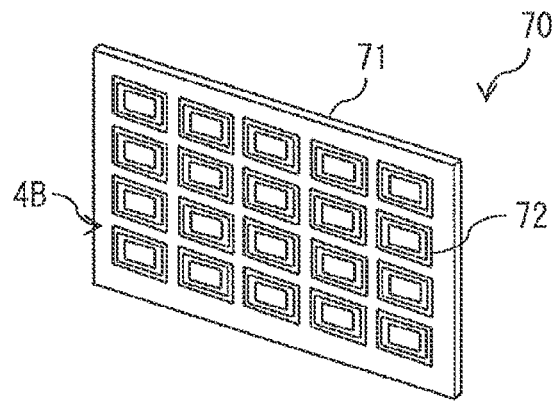
[ FIG. 70 ]
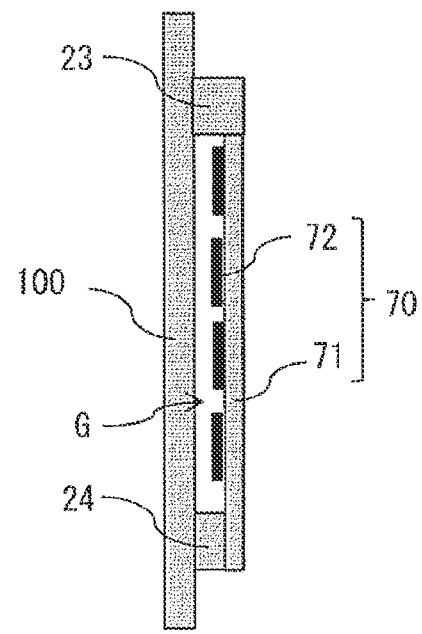

[ FIG. 71 ]
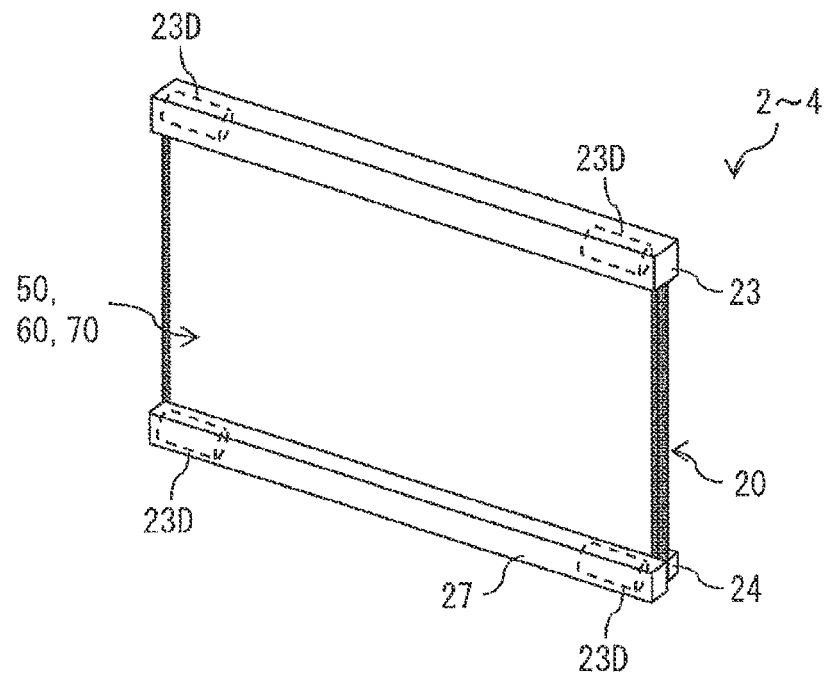
[ FIG. 72 ]
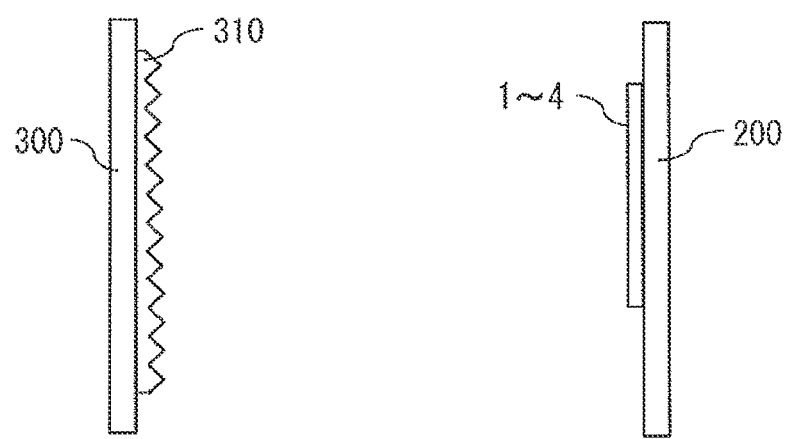

[ FIG. 73 ]
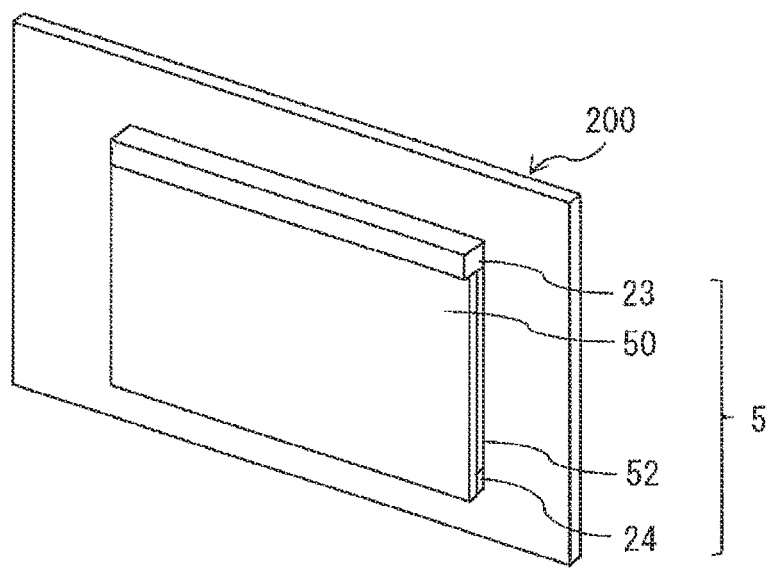
[ FIG. 74 ]
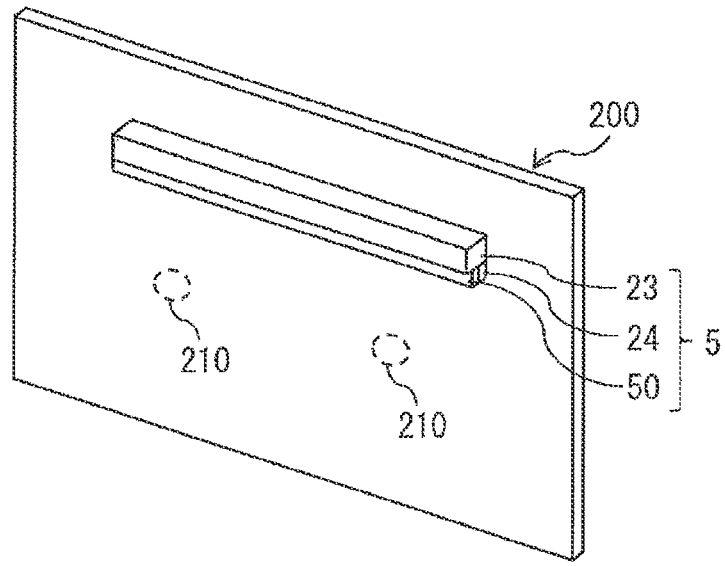

[ FIG. 75 ]
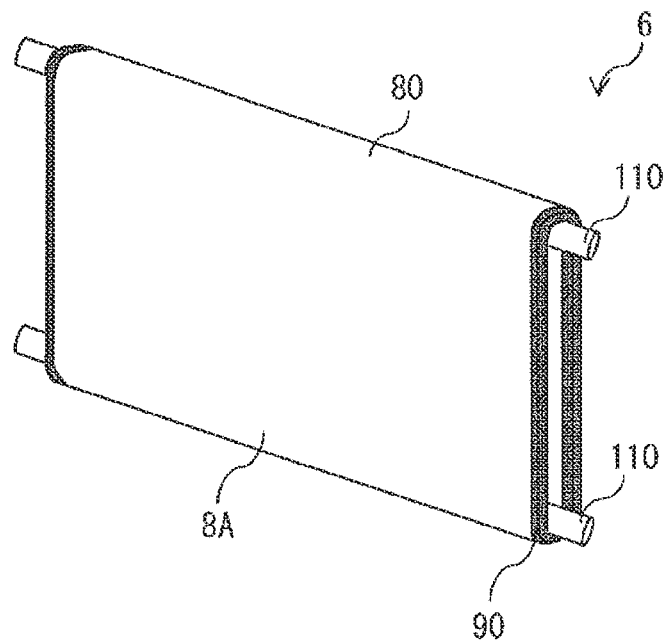
[ FIG. 76 ]
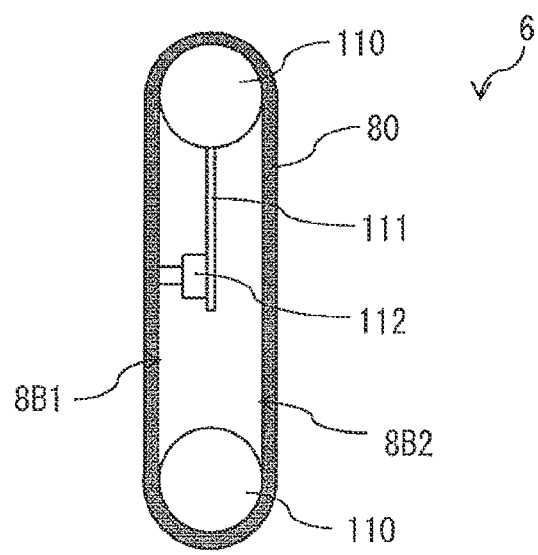

[ FIG. 77 ]
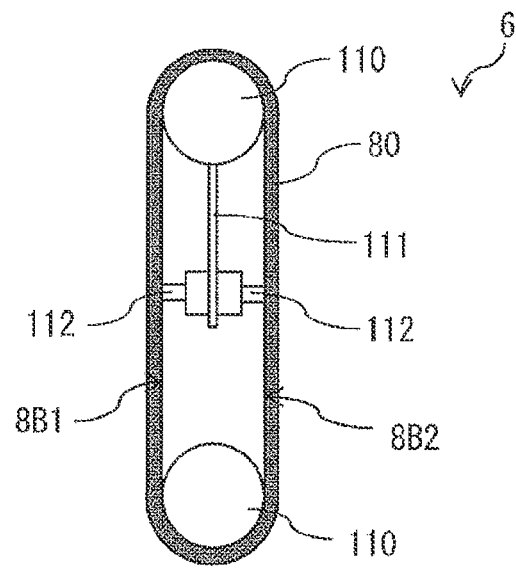
[ FIG. 78 ]
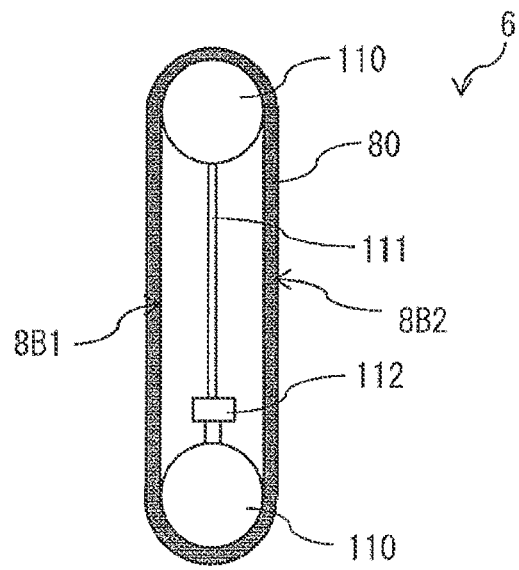

[ FIG. 79 ]
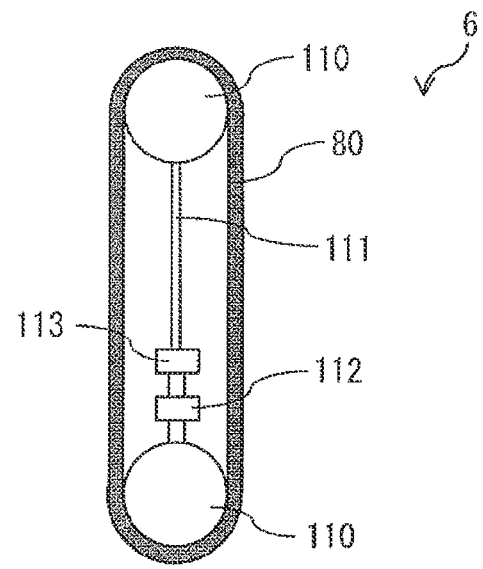
[ FIG. 80 ]
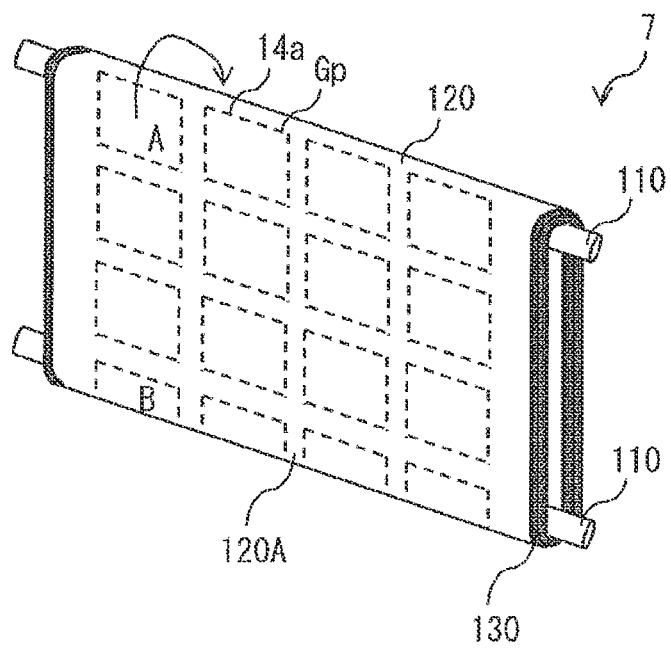

[ FIG. 81 ]
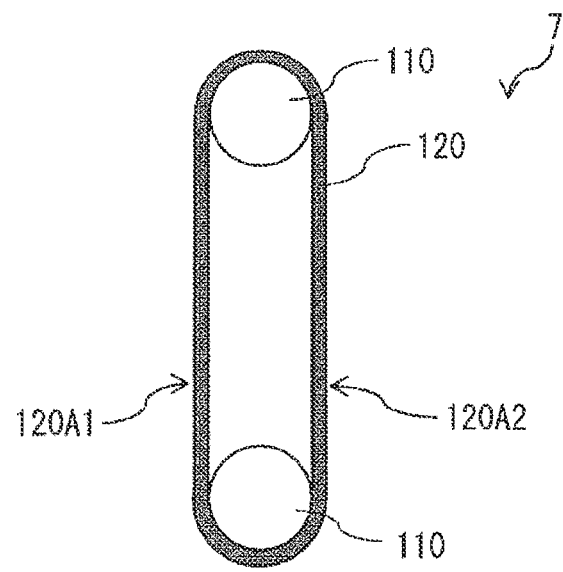
[ FIG. 82 ]
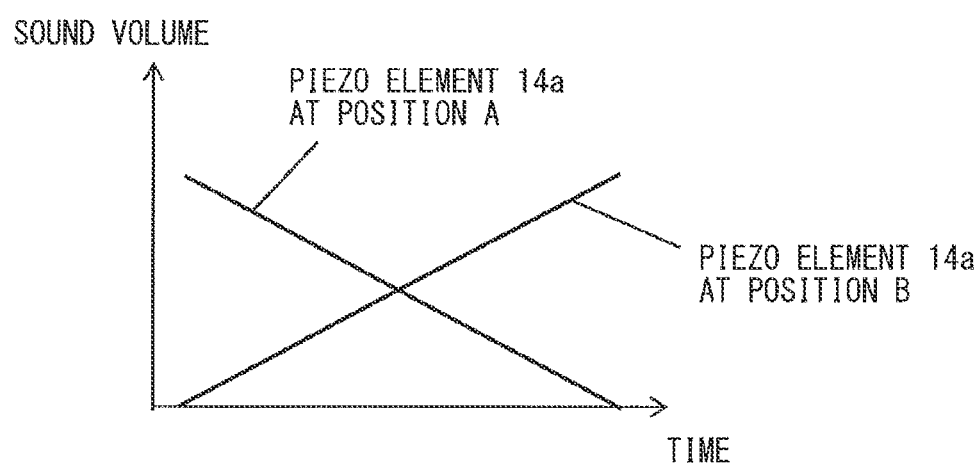

[ FIG. 83 ]
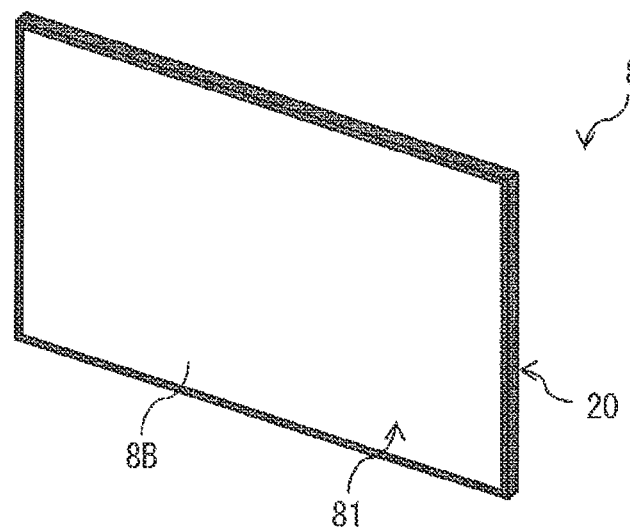
[ FIG. 84 ]
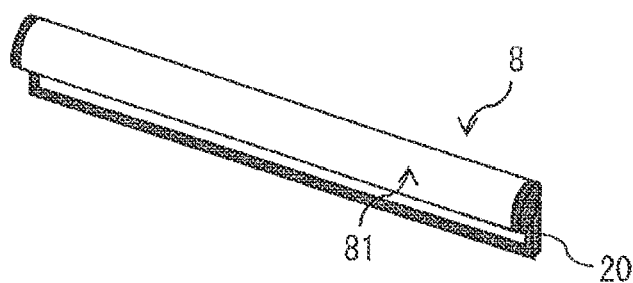
[ FIG. 85 ]
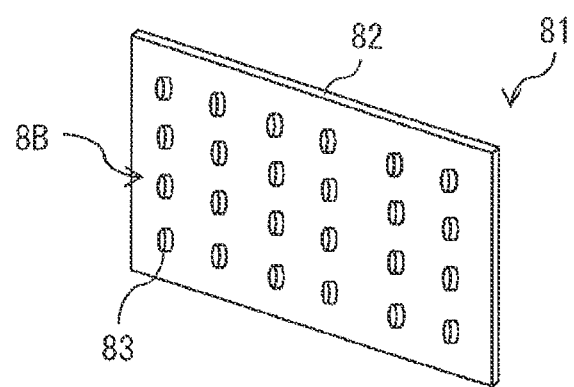

[ FIG. 86 ]
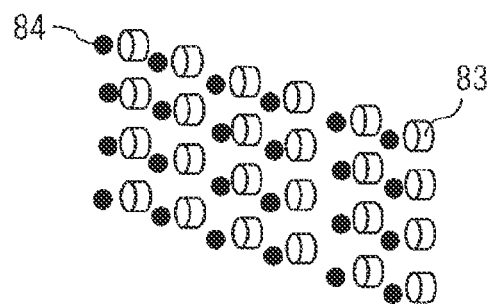
[ FIG. 87 ]
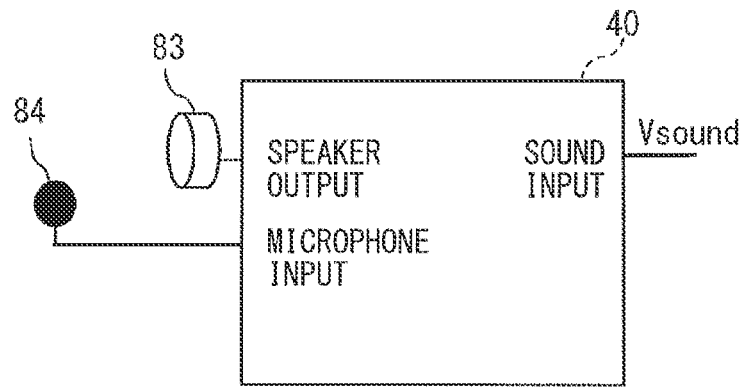
[ FIG. 88 ]
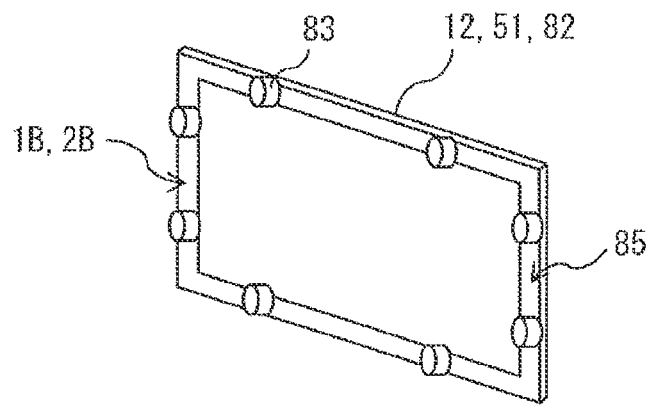

DISPLAY PANEL AND DISPLAY APPARATUS

CROSS REFERENCE TO RELATED APPLICATIONS

The present application is a continuation of U.S. patent application Ser. No. 16/767,673, filed on May 28, 2020, which is a national phase entry under 35 U.S.C. § 371 of International Application No. PCT/JP2018/043685, filed on Nov. 28, 2018, which claims the benefit of Japanese Priority Patent Application No. 2017-235533, filed in the Japanese Patent Office on Dec. 7, 2017, the disclosures of which are hereby incorporated herein by reference.

TECHNICAL FIELD

The present disclosure relates to a display panel and a display apparatus.

BACKGROUND ART

In recent years, flexible display panels have been actively developed. Among such display panels, for example, a thin and flexible display panel using, as a pixel, an organic EL (electro-luminescence) element called OLED (Organic Light Emitting Diode) has attracted attention.

SUMMARY OF THE INVENTION

Incidentally, a display panel and a display apparatus that utilize flexibility are demanded. It is therefore desirable to provide a display panel and a display apparatus that utilize flexibility.

A display panel according to an embodiment of the present disclosure includes a flexible organic electroluminescent panel, and one or a plurality of piezoelectric films provided on a rear surface of the organic electroluminescent panel and vibrating the organic electroluminescent panel as a flat speaker.

A display apparatus according to an embodiment of the present disclosure includes a display panel and a circuit substrate that drives the display panel. In this display apparatus, the display panel includes a flexible organic electroluminescent panel, and one or a plurality of piezoelectric films provided on a rear surface of the organic electroluminescent panel and vibrating the organic electroluminescent panel as a flat speaker.

The display panel and the display apparatus according to embodiments of the present disclosure include, one or a plurality of piezoelectric films that vibrates the organic electroluminescent panel as a flat speaker is provided on a rear surface of the organic electroluminescent panel. This makes it possible to provide the display panel with a sound device, while utilizing flexibility of the organic electroluminescent panel.

BRIEF DESCRIPTION OF THE DRAWINGS

FIG. 1 illustrates a perspective configuration example of a flexible display according to a first embodiment of the present disclosure.

FIG. 2 illustrates an example of a state in which the flexible display of FIG. 1 is wound.

FIG. 3 illustrates a circuit configuration example of the flexible display of FIG.

FIG. 4 illustrates a circuit configuration example of a pixel of FIG. 2.

FIG. 5 illustrates a developed perspective configuration example of a display panel of FIG. 1.

FIG. 6 illustrates a perspective configuration example of a piezo film of FIG. 5.

FIG. 7 illustrates a perspective configuration example of the piezo film of FIG. 5.

FIG. 8 illustrates a developed perspective configuration example of the display panel of FIG. 1.

FIG. 9 illustrates a developed perspective configuration example of the display panel of FIG. 1.

FIG. 10 illustrates a developed perspective configuration example of the display panel of FIG. 1.

FIG. 11 illustrates a developed perspective configuration example of the display panel of FIG. 1.

FIG. 12 illustrates a perspective configuration example of an adhesive layer that may be used in the display panel of FIG. 1.

FIG. 13A illustrates a perspective configuration example of an adhesive layer that may be used in the display panel of FIG. 1.

FIG. 13B illustrates a perspective configuration example of an adhesive layer that may be used in the display panel of FIG. 1.

FIG. 13C illustrates a perspective configuration example of an adhesive layer that may be used in the display panel of FIG. 1.

FIG. 14 illustrates a perspective configuration example of the piezo film of FIG. 5.

FIG. 15 illustrates a perspective configuration example of the piezo film of FIG. 5.

FIG. 16 illustrates a perspective configuration example of the piezo film of FIG. 5.

FIG. 17 illustrates a perspective configuration example of the piezo film of FIG. 5.

FIG. 18 illustrates a perspective configuration example of the piezo film of FIG. 5.

FIG. 19A illustrates a perspective configuration example of an adhesive layer that may be used in the display panel of FIG. 1.

FIG. 19B illustrates a perspective configuration example of an adhesive layer that may be used in the display panel of FIG. 1.

FIG. 19C illustrates a perspective configuration example of an adhesive layer that may be used in the display panel of FIG. 1.

FIG. 20A illustrates a perspective configuration example of an adhesive layer that may be used in the display panel of FIG. 1.

FIG. 20B illustrates a perspective configuration example of an adhesive layer that may be used in the display panel of FIG. 1.

FIG. 20C illustrates a perspective configuration example of an adhesive layer that may be used in the display panel of FIG. 1.

FIG. 21 illustrates a perspective configuration example of a portion of the piezo film and a wiring layer of FIG. 5.

FIG. 22 illustrates a perspective configuration example of the piezo film and the wiring layer of FIG. 5.

FIG. 23 illustrates an example of wiring lines provided on the piezo films of FIG. 16 to FIG. 22.

FIG. 24 illustrates a functional block example of a system circuit substrate of FIG. 1.

FIG. 25 illustrates a modification example of the perspective configuration of the flexible display of FIG. 1.

FIG. 26 illustrates a modification example of the perspective configuration of the flexible display of FIG. 1.

FIG. 27 illustrates a modification example of the perspective configuration of the flexible display of FIG. 1.

FIG. 28 illustrates a modification example of the perspective configuration of the flexible display of FIG. 1.

FIG. 29 illustrates an inner configuration example of a winding mechanism of FIG. 28.

FIG. 30 illustrates an example of a state in which the flexible display of FIG. 28 is wound.

FIG. 31 illustrates a modification example of the perspective configuration of the flexible display of FIG. 1.

FIG. 32 illustrates a modification example of the perspective configuration of the flexible display of FIG. 1.

FIG. 33 illustrates a modification example of the perspective configuration of the flexible display of FIG. 1.

FIG. 34 illustrates a modification example of the perspective configuration of the flexible display of FIG. 1.

FIG. 35 illustrates a modification example of the perspective configuration of the flexible display of FIG. 1.

FIG. 36 illustrates a modification example of the perspective configuration of the flexible display of FIG. 1.

FIG. 37 illustrates an example of sound output in a state in which the display panel is wound by a winding mechanism.

FIG. 38 illustrates an example of sound output in a state in which the display panel is wound by a winding mechanism.

FIG. 39 illustrates a modification example of the perspective configuration of the flexible display of FIG. 1.

FIG. 40 illustrates a modification example of the perspective configuration of the flexible display of FIG. 1.

FIG. 41 illustrates a modification example of the perspective configuration of the flexible display of FIG. 1.

FIG. 42 illustrates a modification example of the perspective configuration of the flexible display of FIG. 1.

FIG. 43 illustrates a modification example of the perspective configuration of the flexible display of FIG. 1.

FIG. 44 illustrates a modification example of the perspective configuration of the flexible display of FIG. 1.

FIG. 45 illustrates a modification example of the perspective configuration of the flexible display of FIG. 1.

FIG. 46 illustrates a functional block example of the system circuit substrate of FIG. 1.

FIG. 47 illustrates a perspective configuration example of a microphone array that may be used in the display panel of FIG. 1, together with a piezo film.

FIG. 48 illustrates a circuit configuration example of a noise cancellation circuit that may be used in a flexible display provided with the microphone array of FIG. 47.

FIG. 49 illustrates an example of directionality of sound output when the flexible display of any of FIG. 1, FIG. 25 to FIG. 28, FIG. 31 to FIG. 36, and FIG. 39 to FIG. 45 is converted into a cylindrical shape.

FIG. 50 illustrates an example of directionality of sound output when the flexible display of any of FIG. 1, FIG. 25 to FIG. 28, FIG. 31 to FIG. 36, and FIG. 39 to FIG. 45 is converted into a cylindrical shape.

FIG. 51 illustrates an example of directionality of sound output when the flexible display of any of FIG. 1, FIG. 25 to FIG. 28, FIG. 31 to FIG. 36, and FIG. 39 to FIG. 45 is converted into a cylindrical shape.

FIG. 52 illustrates a perspective configuration example of a flexible display according to a second embodiment of the present disclosure.

FIG. 53 illustrates an example of a state in which the flexible display of FIG. 52 is wound.

FIG. 54 illustrates a perspective configuration example of a display panel of FIG. 52.

FIG. 55 illustrates an inner configuration example of a winding mechanism of FIG. 52.

FIG. 56 illustrates a perspective configuration example of an actuator of FIG. 52, together with a perspective configuration example of a fixing member of the display panel of FIG. 52.

FIG. 57 illustrates an example of arrangement of actuators and support members when the flexible display of FIG. 52 is converted into a cylindrical shape.

FIG. 58 illustrates an example of the arrangement of the actuators and the support members when the flexible display of FIG. 52 is converted into a cylindrical shape.

FIG. 59 illustrates an example of a state in which the flexible display of FIG. 52 is provided with a curved support member.

FIG. 60 illustrates an example of a state in which the flexible display of FIG. 52 is provided with a support member including an elastic member.

FIG. 61 illustrates an example of a state in which the support member and the actuator in the flexible display of FIG. 52 are provided as a stand separately.

FIG. 62 illustrates an example of a state in which the support member and the actuator in the flexible display of FIG. 52 are provided as a stand separately.

FIG. 63 illustrates a modification example of the support members and the actuators in the flexible display of FIG. 52.

FIG. 64 illustrates a perspective configuration example of a flexible display according to a third embodiment of the present disclosure.

FIG. 65 illustrates an example of a state in which the flexible display of FIG. 64 is wound.

FIG. 66 illustrates a perspective configuration example of a display panel of FIG. 64.

FIG. 67 illustrates a perspective configuration example of a flexible display according to a fourth embodiment of the present disclosure.

FIG. 68 illustrates an example of a state in which the flexible display of FIG. 67 is wound.

FIG. 69 illustrates a perspective configuration example of a display panel of FIG. 67.

FIG. 70 illustrates a cross-sectional configuration example of a state in which the display panel of FIG. 67 is fixed to a wall.

FIG. 71 illustrates a modification example of the perspective configuration of the flexible display of any of FIG. 52, FIG. 64, and FIG. 67.

FIG. 72 illustrates an example of a state in which a sound-absorbing material is provided on a wall that faces a wall on which the flexible display of any of FIG. 1, FIG. 25 to FIG. 28, FIG. 31 to FIG. 36, FIG. 39 to FIG. 45, FIG. 52, FIG. 64, and FIG. 67 is mounted.

FIG. 73 illustrates a perspective configuration example of a flexible display according to a fifth embodiment of the present disclosure, together with a wall.

FIG. 74 illustrates a perspective configuration example of a state in which a display panel depicted in FIG. 73 is wound, together with the wall.

FIG. 75 illustrates a perspective configuration example of a flexible display according to a sixth embodiment of the present disclosure.

FIG. 76 illustrates a side configuration example of the flexible display of FIG. 75.

FIG. 77 illustrates a side configuration example of the flexible display of FIG. 75.

FIG. 78 illustrates a side configuration example of the flexible display of FIG. 75.

FIG. 79 illustrates a side configuration example of the flexible display of FIG. 75.

FIG. 80 illustrates a perspective configuration example of a flexible display according to a seventh embodiment of the present disclosure.

FIG. 81 illustrates a side configuration example of the flexible display of FIG. 80.

FIG. 82 illustrates an example of a sound control in the flexible display of FIG. 80.

FIG. 83 illustrates a perspective configuration example of a flexible display according to an eighth embodiment of the present disclosure.

FIG. 84 illustrates an example of a state in which the flexible display of FIG. 83 is wound.

FIG. 85 illustrates a perspective configuration example of a display panel of FIG. 83.

FIG. 86 illustrates a perspective configuration example of microphones that may be used in the display panel of FIG. 83, together with speakers.

FIG. 87 illustrates a circuit configuration example of a noise cancellation circuit that may be used in a flexible display provided with the microphone of FIG. 86.

FIG. 88 illustrates a modification example of a perspective configuration of a display panel that may be used for the flexible display of any of FIG. 1, FIG. 25 to FIG. 28, FIG. 31 to FIG. 36, FIG. 39 to FIG. 45, FIG. 52, and FIG. 63.

MODES FOR CARRYING OUT THE INVENTION

In the following, description is given in detail of some embodiments for carrying out the present disclosure with reference to the drawings. The following description is merely a specific example of the present disclosure, and the present disclosure is not limited to the following embodiments. Moreover, the present disclosure is not limited to arrangements, dimensions, dimensional ratios, and the like of respective components illustrated in the drawings. It is to be noted that the description is given in the following order.

1. First Embodiment (FIG. 1 to FIG. 24)
2. Modification Examples of First Embodiment (FIG. 25 to FIG. 51)
3. Second Embodiment (FIG. 52 to FIG. 56)
4. Modification Examples of Second Embodiment (FIG. 57 to FIG. 63)
5. Third Embodiment (FIG. 64 to FIG. 66)
6. Fourth Embodiment (FIG. 67 to FIG. 70)
7. Modification Example Common to Respective Embodiments (FIG. 71 and FIG. 72)
8. Fifth Embodiment (FIG. 73 and FIG. 74)
9. Sixth Embodiment (FIG. 75 to FIG. 79)
10. Seventh Embodiment (FIG. 80 to FIG. 82)
11. Eighth Embodiment (FIG. 83 to FIG. 85)
12. Modification Example of Eighth Embodiment (FIG. 86 and FIG. 87)
13. Modification Example Common to First, Second and Eighth Embodiments (FIG. 88)

1. First Embodiment

[Configuration]

FIG. 1 perspectively illustrates a schematic configuration example of a flexible display 1 according to a first embodiment of the present disclosure. FIG. 2 illustrates an example of a state in which the flexible display 1 is wound. FIG. 3 illustrates a circuit configuration example of the flexible display 1. The flexible display 1 corresponds to a specific example of a "display apparatus" of the present disclosure. The flexible display 1 is a thin and flexible self-luminous display using, as a pixel, an organic EL (electro-luminescence) element called OLED (Organic Light Emitting Diode).

The flexible display 1 includes, for example, a display panel 10 having a display surface 1A, and a frame 20 that protects an edge of the display panel 10 (a periphery of the display surface 1A). The flexible display 1 further includes, for example, a system circuit substrate 30 that drives the display panel 10, and an FPC (Flexible printed circuit) 30A that electrically couples the display panel 10 and the system circuit substrate 30. A plurality of pixels 11 are arranged in matrix on the display surface 1A of the display panel 10. The FPC 30A is coupled to the edge of the display panel 10.

FIG. 4 illustrates a circuit configuration example of the pixel 11 of the flexible display 1. The display panel 10 includes, for example, a plurality of gate lines WSL and a plurality of power supply line DSL both extending in a row direction, and a plurality of data lines DTL extending in a column direction. The pixels 11 are provided in a manner corresponding to respective intersections of the data lines DTL and the gate lines WSL. Each of the data lines DTL, each of the gate lines WSL, and each of the power supply line DSL are electrically coupled to output ends of the system circuit substrate 30 via the FPC 30A.

A scanning line WSL is used for selection of each pixel 11, and supplies to each pixel 11 a selection pulse that selects each pixel 11 for each predetermined unit (e.g., pixel row). The signal line DTL is used for supplying to each pixel 11 a signal voltage corresponding to an image signal (a signal voltage Vimage described later), and supplies to each pixel 11 a data pulse including the signal voltage Vimage. The power supply line DSL supplies power to each pixel 11.

Each pixel 11 is, for example, a pixel that emits red light, a pixel that emits green light, or a pixel that emits blue light. It is to be noted that each pixel 11 may be, for example, a pixel that emits another color (e.g., white, yellow, etc.). For example, a plurality of signal lines DTL are assigned to respective pixel columns on a line-by-line basis. For example, a plurality of scanning lines WSL are assigned to respective pixel rows on a line-by-line basis. For example, a plurality of power supply lines DSL are assigned to the respective pixel rows on a line-by-line basis.

Each pixel 11 includes a pixel circuit 11-1 and an organic EL element 11-2. The pixel circuit 11-1 controls emission and extinction of the organic EL element 11-2. The pixel circuit 11-1 has a function of holding a voltage (signal voltage Vimage) written into each pixel 11 by signal writing described later. The pixel circuit 11-1 further has a function of outputting a drive current of a magnitude corresponding to a magnitude of the voltage held to the organic EL element 11-2. The pixel circuit 11-1 includes, for example, a drive transistor Tr1, a write transistor Tr2, and a holding capacitor Cs.

The write transistor Tr2 controls application, to a gate of the drive transistor Tr1, of the signal voltage Vimage corresponding to an image signal. Specifically, the write transistor Tr2 samples a voltage of the signal line DTL, and writes a voltage obtained by the sampling into the gate of the drive transistor Tr1. The writing of the voltage obtained by the sampling to the gate of the drive transistor Tr1 is referred to as signal writing. The drive transistor Tr1 is coupled in series to the organic EL element 11-2. The drive transistor Tr1 drives the organic EL element 11-2. The drive transistor Tr1 controls a current flowing through the organic EL element 11-2 in accordance with the magnitude of the voltage sampled by the write transistor Tr2. The holding capacitor Cs holds a predetermined voltage between the gate and a source of the drive transistor Tr1. The holding capacitor Cs serves to keep a gate-to-source voltage Vgs of the drive transistor Tr1 constant during a predetermined period. It is to be noted that the pixel circuit 11-1 may have a circuit configuration in which various capacitors and transistors are added to the circuit of 2Tr1C described above, or may have a circuit configuration different from the circuit configuration of the 2Tr1C described above.

The gate of the write transistor Tr2 is coupled to the scanning line WSL. A source or a drain of the write transistor Tr2 is coupled to the signal line DTL. A terminal, of the source and the drain of the write transistor Tr2, that is not coupled to the signal line DTL is coupled to the gate of the drive transistor Tr1. The source or a drain of the drive transistor Tr1 is coupled to the power supply line DSL. A terminal, of the source and the drain of the drive transistor Tr1, that is not coupled to the power supply line DSL is coupled to an anode of the organic EL element 11-2. One end of the holding capacitor Cs is coupled to the gate of the drive transistor Tr1. The other end of the holding capacitor Cs is coupled to a terminal, of the source or the drain of the drive transistor Tr1, that is on side of the organic EL element 11-2.

FIG. 5 illustrates a developed perspective configuration example of the display panel 10. The display panel 10 includes, for example, a flexible OLED panel 12, and a flexible piezo film 14 disposed on a rear surface of a heat-dissipating film 13 and vibrating the OLED panel 12 as a flat speaker. The display panel 10 further includes, for example, the flexible heat-dissipating film 13 disposed between the OLED panel 12 and the piezo film 14. The OLED panel 12, the heat-dissipating film 13, and the piezo film 14 are stacked in this order with, for example, an adhesive in between. The display panel 10 is, for example, a stacked body including the OLED panel 12, the heat-dissipating film 13, and the piezo film 14. The display panel 10 corresponds to a specific example of a "stacked body" of the present disclosure. The OLED panel 12 corresponds to a specific example of an "organic electroluminescent panel" of the present disclosure. The piezo film 14 corresponds to a specific example of a "piezoelectric film" of the present disclosure.

The OLED panel 12 is, for example, a panel in which the display surface 1A is provided on a flexible base material 12*bd*. The plurality of pixels 11 are arranged in matrix on the display surface 1A. The base material 12*bd* is, for example, a flexible resin substrate. The base material 12*bd* corresponds to a specific example of a "first base material" of the present disclosure.

The heat-dissipating film 13 dissipates heat generated in the OLED panel 12 and the piezo film 14 to the outside. The heat-dissipating film 13 is preferably configured by a material that does not interfere with vibration of the piezo film 14 as much as possible. The heat-dissipating film 13 is configured by, for example, a foam material or a soft resin.

The piezo film 14 has a function of an actuator of a speaker. The piezo film 14 is, for example, a film in which one or a plurality of piezo elements is provided on a flexible base material 14*bd*. The base material 14*bd* is, for example, a flexible resin substrate. For example, materials of the base material 12*bd* and the base material 14*bd* are different from each other. It is to be noted that the base material 12*bd* and the base material 14*bd* may be configured by a material common to each other. The base material 14*bd* is, for example, a flexible resin substrate. The base material 14*bd* corresponds to a specific example of a "second base material" of the present disclosure. The piezo film 14 vibrates a piezo element on the basis of a signal voltage (signal voltage Vsound described later) corresponding to a sound signal, and transmits the vibration to the OLED panel 12. Accordingly, the OLED panel 12 function as a flat speaker.

FIG. 6 and FIG. 7 each illustrate a perspective configuration example of the piezo film 14. For example, as illustrated in FIG. 6, the piezo film 14 includes, on one base material 14*bd*, one or a plurality of piezo elements 14*a* (14R) provided on right side as viewed from the user and one or a plurality of piezo elements 14*a* (14L) provided on left side as viewed from the user. For example, as illustrated in FIG. 7, the piezo film 14 includes, on one base material 14*bd*, the one or the plurality of piezo elements 14*a* (14R), the one or the plurality of piezo elements 14*a* (14L), and one or a plurality of piezo elements 14*a* (14C) provided at the front as viewed from the user.

FIG. 8 and FIG. 9 each illustrate a developed perspective configuration example of the display panel 10. For example, as illustrated in FIG. 8, the display panel 10 may include the heat-dissipating film 13 on side of a rear surface of the piezo film 14. For example, as illustrated in FIG. 9, the display panel 10 may include the heat-dissipating film 13 not only on side of a front but also on the side of the rear surface of the piezo film 14.

FIG. 10 and FIG. 11 each illustrate a developed perspective configuration example of the display panel 10. For example, as illustrated in FIG. 10, the display panel 10 may include a flexible separation layer 15 between the OLED panel 12 and the piezo film 14. The separation layer 15 alleviates blocking of the vibration of the piezo film 14 caused by the OLED panel 12. The separation layer 15 is formed by, for example, a foam material or a soft resin material. In a case where the display panel 10 includes a plurality of piezo films 14, for example, as illustrated in FIG. 11, the separation layer 15 may be provided for each of the piezo films 14. In this case, for example, the separation layer 15 and the piezo film 14 are alternately arranged in a direction away from the OLED panel 12.

The display panel 10 includes, for example, an adhesive layer that adheres adjacent layers to each other. In the display panel 10, for example, an adhesive layer 16 illustrated in FIG. 12, FIG. 13A, FIG. 13B, or FIG. 13C may be provided between the OLED panel 12 and the heat-dissipating film 13 adjacent to each other. In addition, in the display panel 10, for example, the adhesive layer 16 illustrated in FIG. 12, FIG. 13A, FIG. 13B, or FIG. 13C may be provided between the heat-dissipating film 13 and the separation layer 15 adjacent to each other. In addition, in the display panel 10, for example, the adhesive layer 16 illustrated in FIG. 12, FIG. 13A, FIG. 13B, or FIG. 13C may be provided between the separation layer 15 and the piezo film 14 adjacent to each other.

The adhesive layer 16 is, for example, a sheet-like adhesive layer as illustrated in FIG. 12. The adhesive layer 16 may be, for example, a sheet-like adhesive layer having a plurality of perforations 16A, as illustrated in FIG. 13A. The adhesive layer 16 may be, for example, a plurality of band-shaped adhesive layers 16B separated from each other, as illustrated in FIG. 13B. Each of the band-shaped adhesive layers 16B extends, for example, in a direction across each side of the display panel 10. The adhesive layer 16 may be, for example, a lattice-shaped adhesive layer 16C having a plurality of perforations, as illustrated in FIG. 13C. In the lattice-shaped adhesive layer 16C, for example, a group of parallel lines constituting the lattice extends in a direction across each side of the display panel 10.

FIG. 14, FIG. 15, FIG. 16, FIG. 17 and FIG. 18 each illustrate a perspective configuration example of the piezo film 14. For example, as illustrated in FIG. 14, the piezo film 14 is configured by a plurality of base materials 14*d* separated from each other. The base material 14*d* corresponds to a specific example of a "third base material" of the present disclosure.

The piezo film 14 includes one or a plurality of piezoelectric elements on each base material 14*d*. For example, as illustrated in FIG. 14, the piezo film 14 includes the piezo element 14*a* (14R) provided on the right side as viewed from the user on one base material 14*d* provided on the right side as viewed from the user. For example, as illustrated in FIG. 14, the piezo film 14 further includes the piezo element 14*a* (14L) provided on the left side as viewed from the user on one base material 14*d* provided on the left side as viewed from the user.

For example, as illustrated in FIG. 15, the piezo film 14 includes the piezo element 14*a* (14R) on one base material 14*d* provided on the right side as viewed from the user. For example, as illustrated in FIG. 15, the piezo film 14 further includes the piezo element 14*a* (14L) on one base material 14*d* provided on the left side as viewed from the user. For example, as illustrated in FIG. 15, the piezo film 14 further includes the piezo element 14*a* (14C) provided at the front as viewed from the user on one base material 14*d* provided at the front as viewed from the user. At this time, these three base materials 14*d* each have, for example, a band shape extending in a direction parallel to one side of the display panel 10. Further, these three base materials 14*d* are arranged in a direction orthogonal to the extending direction of the base material 14*d*, for example.

For example, as illustrated in FIG. 16, the piezo film 14 includes the plurality of base materials 14*d* in a band shape extending in a direction parallel to one side of the display panel 10. The plurality of base materials 14*d* are arranged in a direction orthogonal to the extending direction of the base material 14*d*. For example, as illustrated in FIG. 16, the piezo film 14 includes the piezo element 14*a* on each base material 14*d*.

For example, as illustrated in FIG. 17, the piezo film 14 may include the plurality of base materials 14*d* extending in a direction across each side of the display panel 10. At this time, the plurality of base materials 14*d* are arranged, for example, in a direction orthogonal to the extending direction of the base material 14*d*. For example, as illustrated in FIG. 18, the piezo film 14 may include the plurality of base materials 14*d* in a rectangular shape. At this time, the plurality of base materials 14*d* are arranged in matrix, for example.

In a case where the piezo film 14 is configured by the plurality of base materials 14*d* separated from each other, the adhesive layer 16 may be sized to come into contact with a portion of a surface of one base material 14*d* (a surface on side of the OLED panel 12), as illustrated in FIG. 19A, FIG. 19B, and FIG. 19C, for example. At this time, the adhesive layer 16 has, for example, a circular shape as illustrated in FIG. 19A. The adhesive layer 16 may have a star shape, for example, as illustrated in FIG. 19B. The adhesive layer 16 may have a square shape, for example, as illustrated in FIG. 19C.

In a case where the piezo film 14 is configured by the plurality of base materials 14*d* separated from each other, the adhesive layer 16 may be sized to span the plurality of base materials 14*d* as illustrated in FIG. 20A, FIG. 20B, and FIG. 20C, for example. At this time, the adhesive layer 16 has, for example, a circular shape as illustrated in FIG. FIG. 20A, FIG. 20B, and FIG. 20C. The adhesive layer 16 may have a star shape or a square shape, for example.

FIG. 21 and FIG. 22 each illustrate a perspective configuration example of the piezo film 14. The piezo film 14 includes, for example, a wiring layer 14*b* electrically coupled to the piezo element 14*a* in a layer common to the piezo film 14, as illustrated in FIG. 21. The wiring layer 14*b* is, for example, a resin layer including a wiring line L1 electrically coupled to the piezo element 14*a*. For example, as illustrated in FIG. 22, the piezo film 14 may include a wiring layer 17 electrically coupled to the piezo element 14*a* in a layer different from the piezo film 14. The wiring layer 17 is, for example, a wiring substrate in which the wiring line L1 electrically coupled to the piezo element 14*a* is formed on a resin layer. In the wiring layer 14*b* or the wiring layer 17, the wiring line L1 may be configured to allow for active matrix driving of the plurality of piezo elements 14*a* for respective groups Gp, for example, as illustrated in FIG. 23.

FIG. 24 illustrates a functional block example of the system circuit substrate 30. The system circuit substrate 30 includes, for example, a reception circuit 31. The reception circuit 31 has a configuration corresponding to the type of signals to be received. For example, in a case where the reception circuit 31 receives a television broadcast signal, the reception circuit 31 includes, for example, an antenna terminal, a digital tuner, and a demultiplexer.

The antenna terminal is a terminal to which a television broadcast signal received at a receiving antenna (not illustrated) is inputted. For example, the digital tuner processes a television broadcast signal inputted to the antenna terminal, and outputs a predetermined transport stream corresponding to a channel selected by a user. The demultiplexer extracts a partial TS (Transport Stream) corresponding to the channel selected by the user, for example, from the transport stream obtained by the digital tuner, and outputs the extracted partial TS to a processor 32.

For example, in a case where the reception circuit 31 receives an IP (Internet Protocol) signal via an Internet line, the reception circuit 31 receives the IP signal via the Internet line, and performs standard protocol processing in an IP network, for example, on the received IP signal. The reception circuit 31 further extracts the partial TS corresponding to the channel selected by the user from the signal subjected to the protocol processing, and outputs the extracted partial TS to the processor 32.

The system circuit substrate 30 further includes, for example, the processor 32. The processor 32 controls operations of respective components of the flexible display 1. For example, the processor 32 transmits the partial TS obtained at the reception circuit 31 to a decoder 33. The system circuit substrate 30 further includes, for example, the decoder 33, an image signal processing circuit 34, a graphics generation circuit 35, an OLED panel driver 36, a sound signal processing circuit 37, and a sound device driver 38.

For example, the decoder 33 performs decoding processing on an image PES (Packetized Elementary Stream) packet included in the partial TS obtained at the reception circuit 31 to thereby obtain image data. In addition, the decoder 33 performs, for example, decoding processing on a sound PES packet included in the partial TS obtained at the reception circuit 31 to thereby obtain sound data.

The image signal processing circuit 34 and the graphics generation circuit 35 perform, for example, multi-image processing, graphics data superimposition processing, and the like on image data obtained at the decoder 33 as necessary. The image signal processing circuit 34 performs predetermined processing on the image data, and outputs image data subjected to the predetermined processing to the graphics generation circuit 35. The graphics generation circuit 35 generates, for example, a UI (User Interface) screen to be used when displaying the screen. The OLED panel driver 36 drives the OLED panel 12 on the basis of, for example, image data outputted from the graphics generation circuit 35.

The sound signal processing circuit 37 performs, for example, processing such as D/A conversion on sound data obtained at the decoder 33. For example, the sound device driver 38 amplifies a sound signal subjected to processing according to an operation command inputted from the processor 32, and supplies the amplified sound signal to the piezo film 14.

[Effects]

Next, description is given of effects of the display panel 10 and the flexible display 1 according to the present embodiment.

In recent years, flexible display panels have been actively developed. Among such display panels, for example, a thin and flexible display panel using, as a pixel, an organic EL element called OLED has attracted attention. Therefore, a display panel utilizing flexibility has been demanded.

In the present embodiment, one or a plurality of piezo films 14 that vibrate the display panel 10 as a flat speaker is provided on a rear surface of the display panel 10. This makes it possible to provide the display panel 10 with a sound device, while utilizing the flexibility of the display panel 10. Accordingly, it is possible to provide the display panel 10 and the flexible display 1 that utilize the flexibility.

In the present embodiment, a plurality of pixels 11 each including the organic EL element 11-2 may be provided on the base material 12bd, and the one or the plurality of piezo elements 14a may be provided on the base material 14bd. At this time, the materials of the base material 12bd and the base material 14bd are different from each other. This causes internal loss of the display panel 10 to be increased, thus improving sound quality at a high-pitched sound. Accordingly, it is possible to achieve an improvement in the sound quality by utilizing the flexibility.

In the present embodiment, the base material 14bd may be configured by the plurality of base materials 14d separated from each other, and the one or the plurality of piezo elements 14a may be provided for respective base materials 14d. This lowers rigidity of the display panel 10, thus making it easier to wind the display panel 10. Accordingly, it is possible to achieve an improvement in the sound quality without impairing the flexibility.

In the present embodiment, the separation layer 15 that alleviates blocking of the vibration of the piezo film 14 caused by the OLED panel 12 may be provided between the OLED panel 12 and the piezo film 14. Here, the separation layer 15 impairs no flexibility because of the nature thereof. Accordingly, it is possible to achieve an improvement in the sound quality without impairing the flexibility.

In the present embodiment, the adhesive layer 16 is provided that fixes the piezo film 14 to the OLED panel 12, and the adhesive layer 16 may be the sheet-like adhesive layer having the plurality of perforations 16A, the plurality of band-shaped adhesive layers 16B separated from each other, or the lattice-shaped adhesive layer having the plurality of perforations. Thus, the rigidity of the display panel 10 is not excessively increased by the adhesive layer 16, which makes it easier to wind the display panel 10; in addition, no vibration of the piezo film 14 is blocked. Accordingly, it is possible to achieve an improvement in the sound quality without impairing the flexibility.

In the present embodiment, the wiring layer 14b electrically coupled to the piezo element 14a may be provided in a layer common to the piezo film 14. Thus, the rigidity of the display panel 10 is not excessively increased by the wiring layer 14b, which makes it easier to wind the display panel 10; in addition, no vibration of the piezo film 14 is blocked. Accordingly, it is possible to achieve an improvement in the sound quality without impairing the flexibility.

In the present embodiment, the wiring layer 17 electrically coupled to the piezo element 14a may be provided in a layer different from the piezo film 14. This makes it possible to improve durability when rewinding the flexible display 1 many times. In addition, by adopting, for the resin layer inside the wiring layer 17, a material different from that of the resin substrate of the piezo film 14, the internal loss of the display panel 10 is increased, thus improving the sound quality at a high-pitched sound. Accordingly, in such a case, it is possible to improve the sound quality.

In the present embodiment, for example, as illustrated in FIG. 16 to FIG. 18, each of the base material 14d may have a band shape extending in a direction parallel to one side of the display panel 10, and the plurality of base materials 14d may be arranged in a direction orthogonal to the extending direction of the base material 14d. In such a case, it is possible to achieve an improvement in the sound quality without impairing the flexibility of the display panel 10.

In the present embodiment, for example, as illustrated in FIG. 19, each of the base materials 14d may have a band shape extending in a direction across each side of the display panel 10, and the plurality of base materials 14d may be arranged in a direction orthogonal to the extending direction of the base material 14d. In such a case, it is possible to achieve an improvement in the sound quality without impairing the flexibility of the display panel 10.

In the present embodiment, for example, as illustrated in FIG. 20, each of the base materials 14d may have a rectangular shape, and the plurality of base materials 14d may be arranged in matrix. In such a case, it is possible to achieve an improvement in the sound quality without impairing the flexibility of the display panel 10.

In the present embodiment, the base material 14bd is configured by the plurality of base materials 14d separated from each other, and the one or the plurality of piezo elements 14a may be provided for the respective base materials 14d. In such a case, it is possible to achieve an improvement in the sound quality without impairing the flexibility of the display panel 10.

In the present embodiment, circuits that drive the plurality of piezo elements 14a independently for the respective groups Gp may be provided in the system circuit substrate 30. In such a case, it is possible to partially output a sound from the display panel 10 and to simultaneously output sounds different from each other from the display panel 10. Accordingly, it is possible to achieve various sound outputs.

2. Modification Examples of First Embodiment

Next, description is given of modification examples of the first embodiment.

Modification Example A

In the flexible display 1, the display panel 10 functions as a diaphragm of a speaker. Therefore, a degree of deflection of the display panel 10 has a large influence on the sound quality. Accordingly, it is desirable that desired tension be generated with respect to the display panel 10. In order to generate desired tension with respect to the display panel 10, it is desirable to provide a means for pulling the display panel 10 in the foregoing embodiment. In the following, description is given of various means for pulling the display panel 10.

FIG. 25, FIG. 26, FIG. 27 and FIG. 28 each illustrate a perspective configuration example of the flexible display 1. For example, as illustrated in FIG. 25, the display panel 10 includes a support member 21 (a first support member) fixed close to an upper end of the display panel 10, and a support member 21 (a second support member) fixed close to a lower end of the display panel 10. The support member 21, which is the first support member, is fixed close to an upper end of the rear surface of the display panel 10, for example. In addition, the support member 21, which is the second support member, is fixed close to a lower end of the rear surface of the display panel 10, for example.

The support member 21 has, for example, a rod shape extending in a horizontal direction of the display panel 10. For example, when the support member 21 close to the upper end of the display panel 10 is fixed to a wall, the display panel 10 is pulled downward due to an own weight of the support member 21 close to the lower end of the display panel 10. This generates tension in the display panel 10, thus reducing the deflection of the display panel 10. It is to be noted that, for example, as illustrated in FIG. 26, the display panel 10 before being pulled by the support member 21 may have a shape having constriction in a vertical direction. In this case, the display panel 10 may be pulled by the support member 21 to thereby cause the display panel 10 to be deformed into a rectangular shape, for example, as illustrated in FIG. 25. It is to be noted that the support member 21 fixed close to the lower end of the display panel 10 may be fixed to the wall, together with the support member 21. In this case, the two the support members 21 are fixed to the wall to allow the display panel 10 to be pulled in the vertical direction.

For example, as illustrated in FIG. 27, the display panel 10 may include the support member 21 fixed close to the upper end of the display panel 10, and a support mechanism 22 (a second support member) fixed close to the lower end of the display panel 10. The support mechanism 22 includes, for example, a rod-shaped support member 22A extending in the horizontal direction of the display panel 10, and one or a plurality of elastic members 22B provided between the support member 22A and the lower end of the display panel 10. The support member 22A is fixed to the wall, for example, together with the support member 21. The one or the plurality of elastic members 22B are coupled to the support member 22A and the lower end of the display panel 10. The elastic member 22B is, for example, a spring coupled to the support member 22A and the lower end of the display panel 10. In this case, the display panel 10 is pulled downward by the elastic member 22B, and thus tension is generated in the display panel 10, thus reducing the deflection of the display panel 10.

For example, as illustrated in FIG. 28, the display panel 10 may include a winding mechanism 23 (a first support member) fixed close to the upper end of the display panel 10, and a support member 24 (a second support member) fixed close to the lower end of the display panel 10. The support member 24 is fixed close to the lower end of the rear surface of the display panel 10, for example. The support member 24 has, for example, a rod shape extending in the horizontal direction of the display panel 10. Thus, the display panel 10 is pulled downward due to an own weight of the support member 24, which generates tension in the display panel 10, thus reducing the deflection of the display panel 10.

For example, as illustrated in FIG. 29, the winding mechanism 23 includes a winding core 23B that winds the display panel 10, and a box 23A that accommodates the display panel 10 in a state of being wound around the winding core 23B. For example, as illustrated in FIG. 29, the winding mechanism 23 may further include an opening/closing door 23C that opens and closes a lower surface of the box 23A. Closing the opening/closing door 23C causes an inner space of the box 23A to be a closed space. Winding the display panel 10 using the winding mechanism 23 causes the flexible display 1 to have, for example, a rod shape as illustrated in FIG. 30.

In the present modification example, the support member 21 or the winding mechanism 23 is fixed close to the upper end of the display panel 10, and the support member 21, the support mechanism 22, or the support member 24 is fixed close to the lower end of the display panel 10. This generates tension in the display panel 10, thus reducing the deflection of the display panel 10. This makes it possible to achieve an improvement in the sound quality.

In the present modification example, the winding mechanism 23 includes the winding core 23B that winds the display panel 10, and the box 23A that accommodates the display panel 10 in a state of being wound around the winding core 23B. This makes it possible to perform the winding operation of the display panel 10 in a state in which tension is generated in the display panel 10. Accordingly, it is possible to perform the winding operation of the display panel 10 without lowering the sound quality.

Modification Example B

In the flexible display 1 according to the foregoing embodiment and the modification example thereof, a speaker may be provided separately from the OLED panel 12. For example, as illustrated in FIG. 31, one or a plurality of low-range speakers 23D may be provided in the box 23A. At this time, the one or the plurality of low-range speakers 23D may be provided at both ends of the winding core 23B. This enables the box 23A and the opening/closing door 23C to be used as a housing of the low-range speaker 23D, thus making it possible to improve the low-range sound quality, while avoiding an increase in size of the flexible display 1.

In Modification Example B, for example, as illustrated in FIG. 32, a bass reflex duct 23E may be provided in the middle part of the box 23A. The shape of the bass reflex duct 23E is, for example, a rectangular shape or a circular shape. FIG. 32 exemplifies a case where the shape of the bass reflex duct 23E is a rectangular shape. This enables the box 23A and the opening/closing door 23C to be used as a housing of the bass reflex duct 23E, thus making it possible to improve the low-range sound quality, while avoiding an increase in size of the flexible display 1.

In Modification Example B, for example, as illustrated in FIG. 33, respective bass reflex ducts 23F may be provided one by one in the vicinities of both ends of the box 23A. The shape of the bass reflex duct 23F is, for example, a rectangular shape or a circular shape. FIG. 33 exemplifies a case where the shape of the bass reflex duct 23F is a rectangular shape. This enables the box 23A and the opening/closing door 23C to be used as a housing of the bass reflex duct 23F, thus making it possible to improve the low-range sound quality, while avoiding an increase in size of the flexible display 1.

In Modification Example B, for example, as illustrated in FIG. 34, the one or the plurality of low-range speakers 23D may be provided close to the lower end of a front surface of the display panel 10. At this time, a box 27 may be further provided that accommodates the one or the plurality of low-range speakers 23D provided close to the lower end of the front surface of the display panel 10, and is fixed to the lower end of the front surface of the display panel 10. This generates tension in the display panel 10 due to an own weight of the box 27, thus reducing the deflection of the display panel 10. This makes it possible to achieve an improvement in the sound quality. In addition, it is possible to use the box 27 as a housing of the one or the plurality of low-range speakers 23D, thus making it possible to improve the low-range sound quality, while avoiding an increase in size of the flexible display 1.

In Modification Example B, for example, as illustrated in FIG. 35, the box 23A may be omitted. At this time, the winding core 23B may have a tubular shape, and the respective low-range speakers 23D may be provided one by one at both ends of the winding core 23B. At this time, for example, as illustrated in FIG. 36, respective bass reflex ducts 23G may be further provided one by one at both ends of the winding core 23B. The shape of the bass reflex duct 23G is, for example, a rectangular shape or a circular shape. FIG. 36 exemplifies a case where the shape of the bass reflex duct 23G is a rectangular shape. This enables the winding core 23B to be used as a housing of the bass reflex duct 23G, thus making it possible to improve the low-range sound quality, while avoiding an increase in size of the flexible display 1.

Modification Example C

In the flexible display 1 according to the foregoing embodiment and the modification example thereof, it is assumed that the piezo film 14 is configured by the plurality of base materials 14d separated from each other and that the piezo elements 14a are provided on the respective base materials 14d. Further, in the flexible display 1 according to the foregoing embodiment and the modification example thereof, it is assumed that the winding mechanism 23 is provided close to the upper end of the display panel 10 and that the display panel 10 is wound by the winding mechanism 23. In this case, for example, the system circuit substrate 30 may independently drive the plurality of piezo elements 14a for the respective groups Gp separated by the base materials 14d, and may drive the plurality of piezo elements 14a inside the groups Gp present in the frontmost layer of the display panel 10 in a state in which the display panel 10 is wound around the winding core 23B. In such a case, for example, as illustrated in FIG. 37, a sound is outputted from the frontmost layer of the wound display panel 10, and no sound is outputted from a layer other than the frontmost layer (i.e., an inner layer) of the wound display panel 10. As a result, generation of a noise due to the vibration of the display panel 10 is suppressed, thus making it possible to improve the sound quality as compared with the case of outputting a sound from the entire display panel 10.

Modification Example D

For example, as illustrated in FIG. 38, the flexible display 1 according to the foregoing embodiment and the modification example thereof may include a vibration-damping film 28 which may be wound by the winding mechanism 23, while being in contact with a surface of the display panel 10 (specifically, the OLED panel 12). In such a case, the system circuit substrate 30 may drive all the piezo elements 14a simultaneously, for example, even in a state in which the display panel 10 is wound around the winding core 23B. When all the piezo elements 14a are driven, a layer other than the frontmost layer (i.e., the inner layer) of the wound display panel 10 is clamped by the vibration-damping film 28. Accordingly, a sound is outputted only from the frontmost layer of the wound display panel 10, and no sound is outputted from the layer other than the frontmost layer (i.e., the inner layer) of the wound display panel 10. As a result, the generation of a noise due to the vibration of the display panel 10 is suppressed, thus making it possible to improve the sound quality as compared with the case of outputting a sound from the entire display panel 10.

Modification Example E

For example, as illustrated in FIG. 39, FIG. 40, FIG. 41, FIG. 42, FIG. 43, FIG. 44, and FIG. 45, the flexible display 1 according to the foregoing embodiment and the modification example thereof may include a sound-absorbing material 29 on a rearmost surface of the display panel 10. For example, the sound-absorbing material 29 may be formed on the entire rearmost surface of the display panel 10, or may be formed only on a location, of the rearmost surface of the display panel 10, that is not covered with the support member 21, the winding mechanism 23, or the support member 24. When the display panel 10 is mounted on a wall, a pillar, a window, etc., the sound-absorbing material 29 may come in contact with the wall, the pillar, the window, etc. on which the display panel 10 is mounted.

Modification Example F

In the flexible display 1 according to the foregoing embodiment and the modification example thereof, for example, as illustrated in FIG. 46, the system circuit substrate 30 may further include a tension detection circuit 39 that detects pulling force or a corresponding physical quantity applied to the display panel 10. The tension detection circuit 39 detects the pulling force or the corresponding physical quantity applied to the display panel 10, for example, from an amount of displacement assumed for a predetermined input given to each of the piezo elements 14a and a difference from the actual amount of displacement. In this case, the tension detection circuit 39 outputs detection results to the sound signal processing circuit 37. The sound signal processing circuit 37 corrects sound data on the basis of the detection results inputted from the tension detection circuit 39. This causes sound data corresponding to the pulling force applied to the display panel 10 to be inputted to the sound device driver 38, thus making it possible to reduce an influence of the deflection of the display panel 10 on the sound quality.

Modification Example G

In the flexible display 1 according to the foregoing embodiment and the modification example thereof, it is assumed that the piezo film 14 is configured by the plurality of base materials 14d separated from each other and that the one or the plurality of piezo elements 14a are provided on the respective base materials 14d. In this case, for example, as illustrated in FIG. 47, the display panel 10 may further include a microphone array 19 in which one or a plurality of microphones 19a are assigned to the respective base materials 14d of the piezo film 14 on side of the front surface of the display panel 10. At this time, for example, as illustrated in FIG. 48, the system circuit substrate 30 may include a circuit (a noise cancellation circuit 40) that suppresses a noise of the display panel 10 using a sound signal obtained by a microphone 19a. The noise cancellation circuit 40 outputs, to the piezo element 14a of the piezo film 14, a signal obtained by inverting a phase of the sound signal obtained by the microphone 19a, for example. This makes it possible to suppress the noise of the display panel 10.

Modification Example H

In the flexible display 1 according to the foregoing embodiment and the modification example thereof, for example, as illustrated in (A) of FIGS. 49A and (B) of FIG. 49, the display panel 10 may have a cylindrical shape. (A) of FIG. 49 illustrates a perspective configuration example of the flexible display 1 in Modification Example H. (B) of FIG. 49 illustrates a top configuration example of the flexible display 1 in Modification Example H. In Modification Example H, when the display panel 10 has a cylindrical shape, the system circuit substrate 30 may drive each of the piezo elements 14a to allow a sound to be outputted 360 degrees in all directions. In Modification Example H, when the display panel 10 has a cylindrical shape, the system circuit substrate 30 may output a common sound signal to each of the piezo elements 14a, for example.

In Modification Example H, for example, as illustrated in (A) of FIGS. 50 and (B) of FIG. 50, when the display panel 10 has a cylindrical shape, the system circuit substrate 30 may drive the piezo elements 14a independently for the respective groups Gp separated by the base materials 14d to allow a sound to be outputted only in a predetermined angular direction. (A) of FIG. 50 illustrates a perspective configuration example of the flexible display 1 in Modification Example H. (B) of FIG. 50 illustrates a top configuration example of the flexible display 1 in Modification Example H. This enables only a person in a specific direction to hear a sound selectively.

In Modification Example H, for example, as illustrated in FIG. 51, when the display panel 10 has a cylindrical shape, the system circuit substrate 30 may drive the piezo elements 14a independently for the respective group Gp separated by base materials 14d to allow a sound outputted from the upper part of the display panel 10 and a sound outputted from the lower part of the display panel 10 to be different from each other. This makes it possible, for example, to simultaneously output a sound to be heard by an adult and a sound to be heard by a child from the display panel 10, while preventing the adult from hearing the sound to be heard by the child and preventing the child from hearing the sound to be heard by the adult.

3. Second Embodiment

[Configuration]

Next, description is given of a flexible display 2 according to a second embodiment of the present disclosure. FIG. 52 perspectively illustrates a schematic configuration example of the flexible display 2. FIG. 53 illustrates an example of a state in which the flexible display 2 is wound. The flexible display 2 is a thin and flexible self-luminous display using, as a pixel, an organic EL element called OLED.

The flexible display 2 includes, for example, a display panel 50 having a display surface and a rear surface 2B, and a frame 20 that protects an edge of the display panel 50 (a periphery of the display surface). The flexible display 2 further includes, for example, the system circuit substrate 30 that drives the display panel 50, and the FPC 30A that electrically couples the display panel 50 and the system circuit substrate 30. The display panel 50 includes, on the display surface thereof, the plurality of pixels 11 arranged in matrix. The FPC 30A is coupled to the edge of the display panel 50.

FIG. 54 illustrates a perspective configuration example of the display panel 50. The display panel 50 includes, for example, an OLED panel 51. The OLED panel 51 has a configuration similar to that of the OLED panel 12 according to the foregoing embodiment.

The flexible display 2 is provided on the rear surface of the display panel 50 (the OLED panel 51), for example, and includes one or a plurality of actuators 26 that vibrate the display panel 50 (the OLED panel 51) as a flat speaker, and a support member 25 that supports the actuator 26.

The flexible display 2 further includes, for example, the winding mechanism 23 fixed close to the upper end of the display panel 50. Here, the support member 25 is supported by the winding mechanism 23, for example. For example, as illustrated in FIG. 52 and FIG. 53, the support member 25 has a rod shape, and, for example, the end of the support member 25 is movably supported by the winding mechanism 23. For example, as illustrated in FIG. 55, one end of the support member 25 is inserted into an opening 23H of the opening/closing door 23C, and the end of the support member 25 is provided with a protrusion in an extent not to be fallen off from the opening 23H, for example. This makes it possible to dispose the support member 25 along the winding mechanism 23, for example, as illustrated in FIG. 53.

The one or the plurality of actuators 26 incorporates, for example, a magnet having a magnetic pole in an orientation as illustrated in FIG. 56 in a bobbin 26A. It is to be noted that the one or the plurality of actuators 26 may incorporate, for example, a magnet having a magnetic pole in an orientation opposite to that of the magnetic pole illustrated in FIG. 56. For example, as illustrated in FIG. 56, the display panel 50 includes a fixing member 50a configured by a magnet having a magnetic pole in an orientation opposite to the orientation of the magnetic pole of the actuator 26. The fixing member 50a is disposed at a position, of the rear surface 2B of the display panel 50, that faces the one or the plurality of actuators 26. The bobbin 26A is formed by a metal material such as iron. The bobbin 26A has such a length that, when the tip of the bobbin 26A and the fixing member 50a are brought into contact with each other by magnetic force, the magnetic force of the magnet included in the fixing member 50a does not interfere with driving of the one or the plurality of actuators 26.

It is to be noted that the fixing member 50a may include, instead of the magnet, a member that is able to fix the display panel 50 and the actuator 26 to each other. The fixing member 50a may include, for example, a detachable viscous layer instead of the magnet.

[Effects]

In the present embodiment, the one or the plurality of actuators 26 and the support member 25 that supports the one or the plurality of actuators 26 are provided on the rear surface of the display panel 50 including the OLED panel 51 (the OLED panel 51). The one or the plurality of actuators 26 are detachably fixed to the rear surface of the display panel 50 (the OLED panel 51). This makes it possible to provide the display panel 50 with a sound device, while utilizing the flexibility of the display panel 50. Accordingly, it is possible to provide the display panel 50 and the flexible display 2 which utilize the flexibility.

In the present embodiment, the winding mechanism 23 is fixed close to the upper end of the display panel 50 (the OLED panel 51), and the winding mechanism 23 includes the winding core 23B that winds the display panel 50 and the box 23A that accommodates the display panel 50 in a state of being wound around the winding core 23B. This makes it possible to perform the winding operation of the display panel 50 in a state in which tension is generated in the display panel 50. Accordingly, it is possible to perform the winding operation of the display panel 50 without lowering the sound quality.

In the present embodiment, the display panel 50 is provided with the fixing member 50a including a magnet having a magnetic pole in an orientation opposite to the orientation of the magnetic pole of the one or the plurality of actuators 26. This causes the bobbin 26A of the one or the plurality of actuators 26 and the fixing member 50a to be fixed to each other by magnetic force. Furthermore, the bobbin 26A has a predetermined length, thus making it possible to prevent the driving force of the one or the plurality of actuators 26 from being weakened due to the influence of the magnetic force of the magnet included in the fixing member 50a.

4. Modification Examples of Second Embodiment

Next, description is given of modification examples of the second embodiment of the present disclosure.

Modification Example I

In the flexible display 2 according to the foregoing second embodiment, the display panel 50 may have, for example, a cylindrical shape as illustrated in (A) of FIG. 57. At this time, the flexible display 2 may include a plurality of support members 41 and 42 instead of the support member 25, as illustrated in (B) of FIGS. 57 and (C) of FIG. 57, for example. Further, for example, as illustrated in (B) of FIGS. 57 and (C) of FIG. 57, the flexible display 2 according to Modification Example I may include one or a plurality of actuators 43 instead of the one or the plurality of actuators 26. The actuator 43 is, for example, a magnetic actuator or a solid-state piezo actuator. It is to be noted that (A) of FIG. 57 exemplifies a perspective configuration of the flexible display 2 according to Modification Example I. (B) of FIGS. 57 and (C) of FIG. 57 each exemplify the plurality of support members 41 and 42 and the plurality of actuators 43 in the flexible display 2 according to Modification Example I.

The support member 41 is disposed, for example, at a location through which a center axis of the cylindrical display panel 50 passes, and has a rod shape parallel to the center axis of the cylindrical display panel 50. The support member 42 has, for example, a rod shape extending in a direction orthogonal to the support member 41. In each support member 42, one end is fixed to the support member 41, and the other end is fixed to the actuator 43. The support members 41 and 42 support each of actuators 43 from inside the cylindrical display panel 50, and press each of the actuators 43 against an inner surface (rear surface) of the cylindrical display panel 50. This enables the system circuit substrate 30, when the display panel 50 has a cylindrical shape, to drive each of the actuators 43 independently to allow a sound to be outputted 360 degrees in all directions, for example.

In Modification Example I, when the display panel 50 has a cylindrical shape, for example, the system circuit substrate 30 may drive each of the actuators 43 independently to allow a sound to be outputted only in a predetermined angular direction. This enables only a person in a specific direction to hear a sound selectively.

In Modification Example I, for example, when the display panel 50 has a cylindrical shape, the system circuit substrate 30 may drive each of the actuators 43 independently to allow a sound outputted from the upper part of the display panel 50 and a sound outputted from the lower part of the display panel 50 to be different from each other. This makes it possible, for example, to simultaneously output a sound to be heard by an adult and a sound to be heard by a child from the display panel 50, while preventing the adult from hearing the sound to be heard by the child and preventing the child from hearing the sound to be heard by the adult.

In Modification Example I, for example, as illustrated in (A) of FIG. 58, (B) of FIG. 58, and (C) of FIG. 58, the flexible display 2 may further include one or a plurality of dampers 44 that comes into contact with a surface, of the inner surface of the cylindrical display panel 50, between two adjacent actuators 43. In such a case, vibrations of the display panel 50 caused by the two actuators 43 adjacent to each other are separated by the dampers 44. Thus, the vibrations of the display panel 50 caused by the respective actuators 43 enable sounds separated from each other to be outputted from the display panel 50. As a result, it is possible to cause people in different directions to hear different sounds, for example.

Modification Example J

In the flexible display 2 according to the foregoing second embodiment, for example, as illustrated in FIG. 59, the support member 25 may be fixed to the display panel 50 in a curved state. For example, as illustrated in FIG. 59, a holding part 45 including a clip, a nipper, or the like is used to fix the support member 25 to the display panel 50. In such a case, the display panel 50 is pulled, with the actuator 26 as a fulcrum, by force of the support member 25 to return straight. This generates tension in the display panel 50, thus reducing deflection of the display panel 50. As a result, it is possible to achieve an improvement in the sound quality.

Modification Example K

In the flexible display 2 according to the foregoing second embodiment, for example, as illustrated in FIG. 60, the support member 25 may include an elastic member 46 that tends to extend in a direction that reduces the deflection of the display panel 50. In such a case, the display panel 50 is pulled by the force of the support member 25 to extend. This generates tension in the display panel 50, thus reducing the deflection of the display panel 50. As a result, it is possible to achieve an improvement in the sound quality.

Modification Example L

In the flexible display 2 according to the foregoing second embodiment, the support member 25, the actuator 26, and the holding part 45 may be removed from the display panel 50. In this case, for example, as illustrated in FIG. 61 and FIG. 62, a stand 400 in which the support member 25, the actuator 26 and the holding part 45 are supported by a leg part 47 may be provided separately from the display panel 50. It is to be noted that FIG. 61 exemplifies a state in which respective holding parts 45 are provided one by one at both ends of one support member 25, with the actuator 26 being provided at the middle of the support member 25, and one end of the support member 25 being supported by the leg part 47. In addition, FIG. 62 exemplifies a state in which two support members 25 are fixed to each other in an intersecting manner, and respective holding parts 45 are provided one by one at both ends of one support member 25, with respective actuators 26 being provided one by one at both ends of the other support member 25, and one end of the one support member 25 being supported by the leg part 47.

In this manner, in Modification Example L, the stand 400 is provided separately from the display panel 50. This enables the display panel 50 to be mounted on various places, other than a wall, a window, or a pillar.

Modification Example M

For example, as illustrated in FIG. 63, the flexible display 2 according to the foregoing second embodiment may include a vibration mechanism 49 instead of the support member 25, the actuator 26, and the support member 24. The vibration mechanism 49 is provided close to the lower end of the display panel 50, and includes one or a plurality of actuators 49B that vibrates the display panel 50 as a flat speaker, and a support member 49A that supports the one or the plurality of actuators 49B. The actuator 49B is, for example, a magnetic actuator or a solid-state piezo actuator. The support member 49A is fixed to, for example, a wall, a window, a column, and the like.

In this manner, in Modification Example M, the lower end of the display panel 50 is vibrated with the one or the plurality of actuators 49B to thereby cause the display panel 50 to function as a flat speaker. This eliminates the necessity of providing a structure such as a speaker on the rear surface of the display panel 50, thus making it easier to wind the display panel 50. As a result, it is possible to provide the display panel 50 with a sound device, while utilizing the flexibility of the display panel 50. Thus, it is possible to provide the display panel 50 and the flexible display 2 which utilize the flexibility.

In Modification Example M, the winding mechanism 23 is fixed close to the upper end of the display panel 50, and the vibration mechanism 49 is fixed close to the lower end of the display panel 50. This generates tension in the display panel 50, thus reducing the deflection of the display panel 50. This makes it possible to achieve an improvement in the sound quality.

5. Third Embodiment

[Configuration]

Next, description is given of a flexible display 3 according to a third embodiment of the present disclosure. FIG. 64 perspectively illustrates a schematic configuration example of the flexible display 3. FIG. 65 illustrates an example of a state in which the flexible display 3 is wound. The flexible display 3 is a thin and flexible self-luminous display using, as a pixel, an organic EL element called OLED.

The flexible display 3 includes, for example, a display panel 60 having a display surface 3A, and a frame 20 that protects an edge of the display panel 60 (a periphery of the display surface). The flexible display 3 further includes, for example, the system circuit substrate 30 that drives the display panel 60, and the FPC 30A that electrically couples the display panel 60 and the system circuit substrate 30. The display panel 60 includes, on the display surface 3A, the plurality of pixels 11 arranged in matrix. The FPC 30A is coupled to the edge of the display panel 60.

FIG. 66 illustrates a perspective configuration example of the display panel 60. The display panel 60 includes, for example, a flexible OLED panel 61. The OLED panel 61 has a configuration similar to that of the OLED panel 12 according to the foregoing embodiment. The OLED panel 61 corresponds to a specific example of an "organic electroluminescent panel" of the present disclosure.

The display panel 60 further includes one or a plurality of Heil drivers 62 at edges (e.g., both left and right ends) of the OLED panel 61. The one or the plurality of Heil drivers 62 is formed on a protrusion 61A provided at the edge of the OLED panel 61, for example. The Heil driver 62 includes, for example, a wave-shaped electrode 62A having irregularities in a normal direction of the display panel 60, and further includes an electrode formed by arranging a magnet 62B around the wave-shaped electrode 62A. For example, the system circuit substrate 30 causes a current to flow through the electrodes of Heil driver 62 to thereby cause a crest and a trough of the wave-shaped electrode 62A to be opened and closed and to inhale and exhale the air, thus generating an acoustic wave.

[Effects]

In the present embodiment, the one or the plurality of Heil drivers 62 is provided at the edge of the display panel 60 including the OLED panel 61 (the OLED panel 61).

This makes it possible to provide the display panel 60 with a sound device, while utilizing the flexibility of the display panel 50. Thus, it is possible to provide the display panel 60 and the flexible display 3 which utilize the flexibility.

In the present embodiment, the winding mechanism 23 is fixed close to the upper end of the display panel 60, and the support member 24 is fixed close to the lower end of the display panel 60. This generates tension in the display panel 60, thus reducing the deflection of the display panel 60. This makes it possible to achieve an improvement in the sound quality.

6. Fourth Embodiment

[Configuration]

Next, description is given of a flexible display 4 according to a fourth embodiment of the present disclosure. FIG. 67 perspectively illustrates a schematic configuration example of the flexible display 4. FIG. 68 illustrates an example of a state in which the flexible display 4 is wound. The flexible display 4 is a thin and flexible self-luminous display using, as a pixel, an organic EL element called OLED.

The flexible display 4 includes, for example, a display panel 70 having a display surface and a rear surface 4B, and a frame 20 that protects an edge of the display panel 70 (a periphery of the display surface). The flexible display 4 further includes, for example, the system circuit substrate 30 that drives the display panel 70, and the FPC 30A that electrically couples the display panel 70 and the system circuit substrate 30. The display panel 70 includes, on the display surface thereof, the plurality of pixels 11 arranged in matrix. The FPC 30A is coupled to the edge of the display panel 70.

FIG. 69 illustrates a perspective configuration example of the display panel 70. The display panel 70 includes, for example, a flexible OLED panel 71. The OLED panel 71 has a configuration similar to that of the OLED panel 12 according to the foregoing embodiment. The OLED panel 71 corresponds to a specific example of an "organic electroluminescent panel" of the present disclosure.

The display panel 70 further includes one or a plurality of coils 72 on the rear surface 4B of the OLED panel 71. The one or the plurality of coils 72 is provided, for example, on the rear surface 4B of the OLED panel 71, and vibrates the OLED panel 71 as a flat speaker. For example, as illustrated in FIG. 70, the flexible display 4 is fixed to a wall 100 configured by a magnet sheet, with the winding mechanism 23 and the support member 24 in between. In such a state, for example, the system circuit substrate 30 causes a current to flow through the one or the plurality of coils 72 to thereby cause, for example, the one or the plurality of coils 72 and the wall 100 to be magnetically coupled through a gap G, thereby generating a vibration in the one or the plurality of coils 72. This causes the display panel 70 to vibrate as well and to output a sound.

[Effects]

In the present embodiment, the one or the plurality of coils 72 is provided on the rear surface 4B of the OLED panel 71. This makes it possible to provide the display panel 70 with a sound device, while utilizing the flexibility of the display panel 70. Thus, it is possible to provide the display panel 70 and the flexible display 4 which utilize the flexibility.

In the present embodiment, the winding mechanism 23 is fixed close to the upper end of the display panel 70, and the support member 24 is fixed close to the lower end of the display panel 70. This generates tension in the display panel 70, thus reducing the deflection of the display panel 70. This makes it possible to achieve an improvement in the sound quality.

7. Modification Example Common to Respective Embodiments

In the second, third, and fourth embodiments and the Modification Examples thereof, for example, as illustrated in FIG. 71, the one or the plurality of low-range speakers 23D may be provided close to the lower end of the front surface of the display panel 50, 60, or 70. At this time, the box 27 may be further provided that accommodates the one or the plurality of low-range speakers 23D provided close to the lower end of the front surface of the display panel 50, 60, or 70, and is fixed to the lower end of the front surface of the display panel 50, 60, or 70. This generates tension in the display panel 50, 60, or 70 due to an own weight of the box 27, thus reducing the deflection of the display panel 50, 60, or 70. This makes it possible to achieve an improvement in the sound quality. In addition, it is possible to use the box 27 as a housing of the one or the plurality of low-range speakers 23D, thus making it possible to improve the low-range sound quality, while avoiding an increase in size of the flexible display 2, 3, or 4.

In addition, for example, as illustrated in FIG. 72, a wall 300 facing a wall 200 provided with any of the flexible displays 1 to 4 according to the foregoing first, second, third, and fourth embodiments and the Modification Examples thereof may be provided with a sound-absorbing material 310 that absorbs a highly directional sound outputted from any of the flexible displays 1 to 4 according to the first, second, third, and fourth embodiments and the modification example thereof. This makes it possible to suppress reflection of a highly directional sound by the wall 300, thus making it possible to improve the sound quality.

8. Fifth Embodiment

[Configuration]

Next, description is given of a flexible display 5 according to a fifth embodiment of the present disclosure. FIG. 73 perspectively illustrates a schematic configuration example of the flexible display 5, together with the wall 200. FIG. 74 illustrates a perspective configuration example of a state in which the display panel 50 of the flexible display 5 illustrated in FIG. 73 is wound. The flexible display 5 is a thin and flexible self-luminous display using, as a pixel, an organic EL element called OLED.

The flexible display 5 includes, for example, the display panel 50, the winding mechanism 23 disposed close to the upper end of the display panel 50, and the support member 24 disposed close to the lower end of the display panel 50. The flexible display 5 further includes, for example, a vibration-transmitting member 52 provided on the rear surface of the display panel 50 and transmitting vibrations of one or a plurality of actuators 210 embedded in the wall 200 to the display panel 50. The vibration-transmitting member 52 is provided in contact with a location, of the rear surface of the display panel 50, that is not covered with the winding mechanism 23 and the support member 24. The vibration-transmitting member 52 is configured by, for example, a detachable viscous layer that is highly adherent to the wall 200.

In the present embodiment, the vibration-transmitting member 52 that transmits the vibrations of the one or the plurality of actuators 210 embedded in the wall 200 to the display panel 50 is provided on the rear surface of the display panel 50. Thus, even in a case where the flexible display 5 itself is not provided with the actuator, the utilization of the one or the plurality of actuators 210 embedded in the wall 200 enables the display panel 50 to function as a flat speaker.

9. Sixth Embodiment

[Configuration]

Next, description is given of a flexible display 6 according to a sixth embodiment of the present disclosure. FIG. 75 perspectively illustrates a schematic configuration example of the flexible display 6. FIG. 76 illustrates a side configuration example of the flexible display 6 depicted in FIG. 75. The flexible display 6 is a thin and flexible self-luminous display using, as a pixel, an organic EL element called OLED. In addition, the flexible display 6 is a self-luminous display having a roll towel structure.

The flexible display 6 includes, for example, a tubular display panel 80 having a display surface 8A, and a frame 90 that protects an edge of the tubular display panel 80 (a periphery of the display surface 8A). The flexible display 6 further includes, for example, two rotary parts 110 that rotatably support the tubular display panel 80. The two rotary parts 110 are inserted into a void surrounded by the display panel 80, and are in contact with an inner surface (rear surface) of the display panel 80. When the two rotary parts 110 are rotated in a common direction, the display surface 8A of the display panel 80 is displaced.

The flexible display 6 further includes, for example, a support member 111 fixed to one rotary part 110, and one or a plurality of actuators 112 fixed to the support member 111. The support member 111 supports the actuator 112. The actuator 112 is, for example, a magnetic actuator or a solid-state piezo actuator. The one or the plurality of actuators 112 is disposed in contact with an inner surface (rear surface) of the display panel 80, and vibrates the display panel 80 as a flat speaker. A pair of flat surfaces 8B1 and 8B2 is present on the inner surface (rear surface) of the display panel 80. The one or the plurality of actuators 112 is in contact with one flat surface 8B1 of the inner surface (rear surface) of the display panel 80. Thus, a region, of the display surface 6A of the display panel 80, that faces the flat surface 8B1 is vibrated by vibrations of the one or the plurality of actuators 112 to output a sound.

For example, as illustrated in FIG. 77, the flexible display 6 may further include not only the one or the plurality of actuators 112 in contact with the one flat surface 8B1, but also one or a plurality of actuators 112 in contact with another flat surface 8B2, out of the inner surface (rear surface) of the display panel 80. Thus, not only the region facing the one flat surface 8B1, but also the region facing the other flat surface 8B2, out of the display surface 8A of the display panel 80, is vibrated by the vibrations of the one or the plurality of actuators 112 to output a sound.

For example, as illustrated in FIG. 78, the flexible display 6 may include one or a plurality of actuators 112 in contact with the rotary part 110. This causes vibrations of the one or the plurality of actuators 112 to be transmitted to the rotary part 110 in contact with the one or the plurality of actuators 112, causing a vibration of the rotary part 110 to be transmitted to the display panel 80, thus causing a sound to be outputted from the display panel 80.

For example, as illustrated in FIG. 79, the flexible display 6 may include the one or the plurality of actuators 112 in contact with the rotary part 110, and may further include one or a plurality of actuators 113 in contact with the one or the plurality of actuators 112. The actuator 113 is, for example, a magnetic actuator or a solid-state piezo actuator. The one or the plurality of actuators 113 vibrates at a frequency lower than that of the one or the plurality of actuators 112. For example, in a case where the display panel 80 is pressed with a pen or the like, the system circuit substrate 30 causes, in order to prevent damage to the display panel 80, the one or the plurality of actuators 113 to vibrate at a low frequency of about several hundred Hertz, for example, to bring the display panel 80 into deflection.

In the present embodiment, the one or the plurality of actuators 112 vibrates the display surface 8A of the display panel 80 having the roll towel structure to cause a sound to be outputted from the display surface 8A. Accordingly, it is possible to provide the display panel 80 and the flexible display 6 which utilize the flexibility.

10. Seventh Embodiment

[Configuration]

Next, description is given of a flexible display 7 according to a seventh embodiment of the present disclosure. FIG. 80 perspectively illustrates a schematic configuration example of the flexible display 7. FIG. 81 illustrates a side configuration example of the flexible display 7 illustrated in FIG. 80. The flexible display 7 is a thin and flexible self-luminous display using, as a pixel, an organic EL element called OLED. In addition, the flexible display 7 is a self-luminous display having the roll towel structure.

The flexible display 7 includes, for example, a tubular display panel 120 having a display surface 120A, and a frame 130 that protects an edge of the tubular display panel 120 (a periphery of the display surface 120A). The flexible display 7 further includes, for example, the two rotary parts 110 that rotatably support the tubular display panel 120. The two rotary parts 110 are inserted in a void surrounded by the display panel 120, and are in contact with an inner surface (rear surface) of the display panel 120. A pair of flat surfaces 120A1 and 120A2 is present on the display surface 120A of the display panel 120. When the two rotary parts 110 are rotated in a common direction, the display surface 120A of the display panel 80 is displaced.

The display panel 120 has a configuration common to that of that of the display panel 10 according to the foregoing embodiment. Specifically, the display panel 120 is a stacked body including, for example, the OLED panel 12, the heat-dissipating film 13, and the one or the plurality of piezo films 14 in this order. The display panel 120 may further include, for example, the separation layer 15 and the adhesive layer 16. In the display panel 120, the piezo film 14 includes the plurality of base materials 14d as illustrated in FIG. 18, FIG. 19, or FIG. 20, for example. The piezo film 14 includes the piezo elements 14a on the respective base materials 14d as illustrated in FIG. 18, FIG. 19, or FIG. 20, for example. Accordingly, a vibration due to the piezo film 14 is transmitted to the OLED panel 12, thus causing a sound to be outputted from the OLED panel 12.

FIG. 82 illustrates an example of a sound control in the flexible display 7. The system circuit substrate 30 rotates the two rotary parts 110 to thereby rotate an image displayed on the display surface 120A of the display panel 120. At this time, for example, in a case where there is an image beginning to be displayed on the flat surface 120A1, the system circuit substrate 30 drives the piezo element 14a (e.g., a piezo element 14a at a position B) to allow a sound volume corresponding to the image to gradually increase. In addition, for example, in a case where there is an image beginning to deviate from the flat surface 120A1, the system circuit substrate 30 drives the piezo element 14a (e.g., a piezo element 14a at a position A) to allow a sound volume corresponding to the image to gradually decrease.

In the present embodiment, the piezo film 14 vibrates the display surface 120A of the display panel 120 having the roll towel structure to cause a sound to be outputted from display surface 120A. Accordingly, it is possible to provide the display panel 120 and the flexible display 7 which utilize the flexibility.

11. Eighth Embodiment

[Configuration]

Next, description is given of a flexible display 8 according to an eighth embodiment of the present disclosure. FIG. 83 perspectively illustrates a schematic configuration example of the flexible display 8. FIG. 84 illustrates an example of a state in which the flexible display 8 is wound. The flexible display 8 is a thin and flexible self-luminous display using, as a pixel, an organic EL element called OLED.

The flexible display 8 includes, for example, a display panel 81 having a display surface and a rear surface 8B, and a frame 20 that protects an edge of the display panel 81 (a periphery of the display surface). The flexible display 8 further includes, for example, the system circuit substrate 30 that drives the display panel 81, and the FPC 30A that electrically couples the display panel 81 and the system circuit substrate 30. The display panel 81 includes, on the display surface thereof, the plurality of pixels 11 arranged in matrix. The FPC 30A is coupled to the edge of the display panel 81.

FIG. 85 illustrates a perspective configuration example of the display panel 81. The display panel 81 includes, for example, an OLED panel 82, and a plurality of speakers 83 on a rear surface (the rear surface 8B) of the OLED panel 82. The OLED panel 82 has a configuration similar to that of the OLED panel 12 according to the foregoing embodiment.

[Effects]

In the present embodiment, the plurality of speakers 83 is provided on the rear surface of the display panel 81. This makes it possible to provide the display panel 81 with a sound device, while utilizing the flexibility of the display panel 81. Accordingly, it is possible to provide the display panel 81 and the flexible display 8 which utilize the flexibility.

12. Modification Example of Eighth Embodiment

In the foregoing eighth embodiment, for example, as illustrated in FIG. 86, the display panel 81 may further include a microphone array in which one or a plurality of microphones 84 are assigned to the respective speakers 83. At this time, for example, as illustrated in FIG. 87, the system circuit substrate 30 may include a circuit (the noise cancellation circuit 40) that suppresses a noise of the speaker 83 using a sound signal obtained by the microphone 84. The noise cancellation circuit 40 outputs, to the speaker 83, a signal obtained by inverting a phase of the sound signal obtained by the microphone 84. This makes it possible to suppress the noise of the speaker 83.

13. Modification Example Common to First, Second and Eighth Embodiments

In the foregoing 13. first, second, and eighth embodiments, for example, as illustrated in FIG. 88, the display panel 12, 51, or 82 may include, on an outer edge of the display panel 12, 51, or 82, an acoustic transmission part 85, and the plurality of speakers 83 at positions facing the acoustic transmission part 85. The acoustic transmission part 85 has, for example, a plurality of through-holes penetrating the display panel 12, 51, or 82. The acoustic transmission part 85 may have, for example, a non-woven fabric shape. This allows a sound from each of the speakers 83 to propagate in front of the display panel 12, 51, or 82 through the acoustic transmission part 85. Accordingly, it is possible to achieve an improvement in the sound quality.

Although the description has been given of the present disclosure with reference to the plurality of embodiments, the present disclosure is not limited to the foregoing embodiments, and may be modified in a variety of ways. It is to be noted that effects described herein are merely examples. Effects of the present disclosure are not limited to the effects described herein. The present disclosure may have effects other than the effects described herein.

Moreover, for example, the present disclosure may have the following configurations.

(1) A display panel including:
a flexible organic electroluminescent panel; and
one or a plurality of piezoelectric films provided on a rear surface of the organic electroluminescent panel, and vibrating the organic electroluminescent panel as a flat speaker.

(2) The display panel according to (1), in which
the organic electroluminescent panel includes, on a first base material, a plurality of pixels each including an organic electroluminescent element,
the piezoelectric film includes one or a plurality of piezoelectric elements on a second base material, and
materials of the first base material and the second base material are different from each other.

(3) The display panel according to (2), in which
the second base material is configured by a plurality of third base materials separated from each other, and
the one or the plurality of piezoelectric elements are provided for the respective third base materials.

(4) The display panel according to any one of (1) to (3), further including a separation layer provided between the organic electroluminescent panel and the piezoelectric film, the separation layer alleviating blocking of a vibration of the piezoelectric film caused by the organic electroluminescent panel.

(5) The display panel according to any one of (1) to (4), further including an adhesive layer that fixes the piezoelectric film to the organic electroluminescent panel, in which
the adhesive layer includes a sheet-like adhesive layer having a plurality of perforations, a plurality of band-shaped adhesive layers separated from each other, or a lattice-shaped adhesive layer.

(6) The display panel according to (3), further including a wiring layer electrically coupled to the piezoelectric element in a layer common to the piezoelectric film or in a layer different from the piezoelectric film.

(7) The display panel according to any one of (1) to (6), further including:
a stacked body including the organic electroluminescent panel and the one or the plurality of piezoelectric films;
a first support member fixed close to an upper end of the stacked body; and
a second support member fixed close to a lower end of the stacked body.

(8) The display panel according to (7), in which the first support member includes a winding core that winds the stacked body, and a box that accommodates the stacked body in a state of being wound around the winding core.

(9) The display panel according to (8), in which the first support member further includes a low-range speaker in the box.

(10) The display panel according to (7), in which the first support member includes a winding core that winds the stacked body.

(11) The display panel according to (10), in which the first support member further includes a low-range speaker incorporated in each of both ends of the winding core.

(12) The display panel according to any one of (7) to (11), in which the second support member includes an elastic member that pulls the stacked body downward.

(13) The display panel according to any one of (7) to (12), in which the stacked body includes a sound-absorbing material on a rearmost surface.

(14) A display apparatus including:
a display panel; and
a circuit substrate that drives the display panel,
the display panel including
a flexible organic electroluminescent panel, and
one or a plurality of piezoelectric films provided on a rear surface of the organic electroluminescent panel, and vibrating the organic electroluminescent panel as a flat speaker.

(15) The display panel according to (3), in which
each of the third base materials has a band shape extending in a direction parallel to one side of the display panel, and
the plurality of third base materials are arranged in a direction orthogonal to the extending direction of each of the third base materials.

(16) The display panel according to (3), in which
each of the third base materials has a band shape extending in a direction across each side of the display panel, and
the plurality of third base materials are arranged in a direction orthogonal to the extending direction of each of the third base materials.

(17) The display panel according to (3), in which
each of the third base materials has a rectangular shape, and
the plurality of third base materials are arranged in matrix.

(18) The display panel according to (9), in which the box includes a bass reflex duct.

(19) The display panel according to (11), in which the winding core has a tubular shape and includes a bass reflex duct.

(20) The display panel according to (7), in which the second support member includes a low-range speaker and a box that accommodates the low-range speaker.

(21) The display panel according to any one of (1) to (6), further including:
a tubular stacked body including the organic electroluminescent panel and the one or the plurality of piezoelectric films; and
a rotary part that rotatably supports the tubular stacked body.

(22) The display apparatus according to (14), in which
the organic electroluminescent panel includes, on a first base material, a plurality of pixels each including an organic electroluminescent element,
the piezoelectric film includes one or a plurality of piezoelectric elements on a second base material, and
materials of the first base material and the second base material are different from each other.

(23) The display apparatus according to (22), in which
the second base material is configured by a plurality of third base materials separated from each other, and
the one or the plurality of piezoelectric elements are provided for the respective third base materials.

(24) The display apparatus according to (23), in which
the display panel includes a stacked body including the organic electroluminescent panel and the plurality of piezoelectric films,
the stacked body further includes a microphone array in which one or a plurality of microphones are assigned for the respective third base materials, and
the circuit substrate includes a circuit that suppresses a vibration of the piezoelectric film on side of a rearmost surface of the stacked body using a sound signal obtained by the microphone array.

(25) The display apparatus according to (23), in which the circuit substrate includes a circuit that drives the plurality of piezoelectric elements independently for respective groups separated by the third base materials.

(26) The display apparatus according to (23), in which
the display panel includes
a stacked body including the organic electroluminescent panel and the plurality of piezoelectric films, and
a winding core fixed close to an upper end of the stacked body, and winding the stacked body, and
the circuit substrate drives the plurality of piezoelectric elements independently for respective groups separated by the third base materials, and drives the plurality of piezoelectric elements in the groups present in a frontmost layer of the stacked body in a state in which the stacked body is wound around the winding core.

(27) The display apparatus according to (23), in which, when the stacked body has a cylindrical shape, the circuit substrate drives the plurality of piezoelectric elements independently for respective groups separated by the third base materials to allow a sound to be outputted only in a predetermined angular direction.

(28) The display apparatus according to (23), in which, when the stacked body has a cylindrical shape, the circuit substrate drives the plurality of piezoelectric elements independently for respective groups separated by the third base materials to allow a sound outputted from an upper part of the stacked body and a sound outputted from a lower part of the stacked body to be different from each other.

(29) The display apparatus according to (23), in which
the display panel includes a tubular stacked body including the organic electroluminescent panel and the one or the plurality of piezoelectric films, and includes a rotary part that rotatably supports the tubular stacked body,
the circuit substrate drives the plurality of piezoelectric elements to cause a sound volume to gradually increase, the piezoelectric elements belonging to the groups that begin to enter the display surface in association with rotation of the stacked body by the rotary part, and
the circuit substrate drives the plurality of piezoelectric elements to cause the sound volume to gradually decrease, the piezoelectric elements belonging to the groups that begin to deviate from the display surface in association with rotation of the stacked body by the rotary part.

(30) A display panel including:
a flexible organic electroluminescent panel;
one or a plurality of magnetic actuators or solid-state piezo actuators provided on a rear surface the organic electroluminescent panel, and vibrating the organic electroluminescent panel as a flat speaker; and
a first support member that supports the magnetic actuator or the solid-state piezo actuator.

(31) The display panel according to (30), further including a second support member fixed close to an upper end of the organic electroluminescent panel, in which
the second support member includes
a winding core that winds the organic electroluminescent panel, and
a box that accommodates the organic electroluminescent panel in a state of being wound around the winding core, and
the first support member is supported by the box.

(32) The display panel according to (30) or (31), in which the organic electroluminescent panel includes a magnet having a magnetic pole in an orientation opposite to an orientation of a magnetic pole of the magnetic actuator.

(33) The display panel according to (30), in which
the stacked body has a cylindrical shape, and
the first support member supports the magnetic actuator or the solid-state piezo actuator from inside the cylindrical stacked body.

(34) The display panel according to (33), further including a vibration-damping member interposed in contact between two of the magnetic actuators adjacent to each other or between two of the solid-state piezo actuators adjacent to each other, out of an inner surface of the stacked body.

(35) The display panel according to (33), in which the first support member is fixed to the organic electroluminescent panel in a curved state.

(36) The display panel according to (33), in which the first support member includes an elastic member that tends to extend in a direction that reduces deflection of the organic electroluminescent panel.

(37) A display panel including:
a flexible organic electroluminescent panel; and
one or a plurality of Heil drivers provided at an edge of the organic electroluminescent panel.

(38) The display panel according to (37), including a support member fixed close to an upper end of the organic electroluminescent panel, in which
the support member includes
a winding core that winds the organic electroluminescent panel, and
a box that accommodates the organic electroluminescent panel in a state of being wound around the winding core.

(39) A display panel including:
a flexible organic electroluminescent panel; and
one or a plurality of coils provided on a rear surface of the organic electroluminescent panel, and vibrating the organic electroluminescent panel as a flat speaker.

(40) The display panel according to (39), including a support member fixed close to an upper end of the organic electroluminescent panel, in which
the support member includes
a winding core that winds the organic electroluminescent panel, and
a box that accommodates the organic electroluminescent panel in a state of being wound around the winding core.

(41) A display panel including:
a flexible organic electroluminescent panel;
one or a plurality of actuators provided close to a lower end of the organic electroluminescent panel, and vibrating the organic electroluminescent panel as a flat speaker; and
a first support member that supports the one or the plurality of actuators.

(42) The display panel according to (41), including a second support member fixed close to an upper end of the organic electroluminescent panel, in which
the second support member includes
a winding core that winds the organic electroluminescent panel, and
a box that accommodates the organic electroluminescent panel in a state of being wound around the winding core.

(43) The display panel according to (8), further including a vibration-damping film that is windable around the winding core in a state of being in contact with a surface of the organic electroluminescent panel.

(44) The display apparatus according to (14), in which the circuit substrate includes a tension detection circuit that detects pulling force or a corresponding physical quantity applied to the organic electroluminescent panel.

(45) A display panel including:
a flexible organic electroluminescent panel;
one or a plurality of magnetic actuators or solid-state piezo actuators provided on a rear surface of the organic electroluminescent panel, and vibrating the organic electroluminescent panel as a flat speaker;
a first support member that supports the magnetic actuator or the solid-state piezo actuator; and
a second support member fixed close to a lower end of the organic electroluminescent panel,
the second support member including a low-range speaker and a box that accommodates the low-range speaker.

(46) A display panel including:
a flexible organic electroluminescent panel;
one or a plurality of Heil drivers provided at an edge of the organic electroluminescent panel; and
a second support member fixed close to a lower end of the organic electroluminescent panel,
the second support member including a low-range speaker and a box that accommodates the low-range speaker.

(47) A display panel including:
a flexible organic electroluminescent panel;
one or a plurality of coils provided on a rear surface of the organic electroluminescent panel, and vibrating the organic electroluminescent panel as a flat speaker; and
a second support member fixed close to a lower end of the organic electroluminescent panel,
the second support member including a low-range speaker and a box that accommodates the low-range speaker.

According to the display panel and the display apparatus according to the embodiments of the present disclosure, it is possible to provide the display panel with a sound device, while utilizing the flexibility of the organic electroluminescent panel, thus making it possible to provide the display panel and display apparatus which utilize the flexibility. It is to be noted that effects of the present disclosure are not necessarily limited to the effects described herein, and may be any of the effects described herein.

It should be understood by those skilled in the art that various modifications, combinations, sub-combinations, and alterations may occur depending on design requirements and other factors insofar as they are within the scope of the appended claims or the equivalents thereof.

The invention claimed is:
1. A display panel comprising:
a flexible organic electroluminescent panel;
one or a plurality of piezoelectric films provided on a rear surface of the organic electroluminescent panel, and vibrating the organic electroluminescent panel as a flat speaker;
a stacked body including the organic electroluminescent panel and the one or the plurality of piezoelectric films;
a first support member fixed close to an upper end of the stacked body; and
a second support member fixed close to a lower end of the stacked body, wherein the second support member includes an elastic member that pulls the stacked body downward.

2. The display panel according to claim 1, wherein
the organic electroluminescent panel includes, on a first base material, a plurality of pixels each including an organic electroluminescent element,
the piezoelectric film includes one or a plurality of piezoelectric elements on a second base material, and
materials of the first base material and the second base material are different from each other.

3. The display panel according to claim 2, wherein
the second base material is configured by a plurality of third base materials separated from each other, and
the one or the plurality of piezoelectric elements are provided for the respective third base materials.

4. The display panel according to claim 3, further comprising a wiring layer electrically coupled to the piezoelectric element in a layer common to the piezoelectric film or in a layer different from the piezoelectric film.

5. The display panel according to claim 1, further comprising a separation layer provided between the organic electroluminescent panel and the piezoelectric film, the separation layer alleviating blocking of a vibration of the piezoelectric film caused by the organic electroluminescent panel.

6. The display panel according to claim 1, further comprising an adhesive layer that fixes the piezoelectric film to the organic electroluminescent panel, wherein
the adhesive layer comprises a sheet-like adhesive layer having a plurality of perforations, a plurality of band-shaped adhesive layers separated from each other, or a lattice-shaped adhesive layer.

7. The display panel according to claim 1, wherein the first support member includes a winding core that winds the stacked body, and a box that accommodates the stacked body in a state of being wound around the winding core.

8. The display panel according to claim 7, wherein the first support member further includes a low-range speaker in the box.

9. The display panel according to claim 1, wherein the first support member includes a winding core that winds the stacked body.

10. The display panel according to claim 9, wherein the first support member further includes a low-range speaker incorporated in each of both ends of the winding core.

11. The display panel according to claim 1, wherein the stacked body includes a sound-absorbing material on a rearmost surface.

12. A display apparatus comprising:
a display panel; and
a circuit substrate that drives the display panel,
the display panel including
a flexible organic electroluminescent panel,
one or a plurality of piezoelectric films provided on a rear surface of the organic electroluminescent panel, and vibrating the organic electroluminescent panel as a flat speaker,
a stacked body including the organic electroluminescent panel and the one or the plurality of piezoelectric films,
a first support member fixed close to an upper end of the stacked body, and
a second support member fixed close to a lower end of the stacked body, wherein the second support member includes an elastic member that pulls the stacked body downward.

* * * * *